US009508774B2

(12) United States Patent
Iizuka

(10) Patent No.: US 9,508,774 B2
(45) Date of Patent: Nov. 29, 2016

(54) SEMICONDUCTOR DEVICE AND MANUFACTURING METHOD OF THE SAME

(71) Applicant: Renesas Electronics Corporation, Kawasaki-shi, Kanagawa (JP)

(72) Inventor: Koji Iizuka, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/082,303

(22) Filed: Nov. 18, 2013

(65) Prior Publication Data

US 2014/0151838 A1  Jun. 5, 2014

(30) Foreign Application Priority Data

Nov. 30, 2012  (JP) .................................. 2012-262828

(51) Int. Cl.
*H01L 27/148*  (2006.01)
*H01L 27/146*  (2006.01)

(52) U.S. Cl.
CPC ... *H01L 27/14685* (2013.01); *H01L 27/14601* (2013.01); *H01L 27/14636* (2013.01); *H01L 27/14683* (2013.01); *H01L 27/146* (2013.01); *H01L 27/14621* (2013.01); *H01L 27/14643* (2013.01)

(58) Field of Classification Search
CPC .......... H01L 27/146; H01L 27/14601; H01L 27/14643; H01L 27/14685; H01L 27/14636; H01L 27/14683; H01L 27/14621
See application file for complete search history.

(56) References Cited

U.S. PATENT DOCUMENTS

| 6,465,872 B2 | 10/2002 | Tada |
| 7,994,614 B2 | 8/2011 | Tanaka et al. |
| 8,193,614 B2 | 6/2012 | Yamada et al. |
| 8,298,919 B2 | 10/2012 | Kogawa et al. |
| 8,742,547 B2 | 6/2014 | Yoshizawa et al. |
| 2005/0104150 A1* | 5/2005 | Wetzel ................ H01L 21/0276 257/437 |
| 2008/0230874 A1* | 9/2008 | Yamada .................. H01L 21/78 257/620 |
| 2008/0277705 A1* | 11/2008 | Takahashi et al. ........... 257/295 |
| 2009/0057842 A1* | 3/2009 | He et al. ........................ 257/620 |
| 2009/0115024 A1* | 5/2009 | Jeng ...................... H01L 23/562 257/620 |
| 2011/0127631 A1* | 6/2011 | Kawashima ...... H01L 27/14603 257/466 |
| 2011/0272774 A1 | 11/2011 | Itagaki |

FOREIGN PATENT DOCUMENTS

JP   3129855 A   6/1991
JP   6-77315 A   3/1994
(Continued)

OTHER PUBLICATIONS

Communication dated Jun. 28, 2016, from the Japanese Patent Office in counterpart application No. 2012-262828.

*Primary Examiner* — Su C Kim
(74) *Attorney, Agent, or Firm* — Sughrue Mion, PLLC

(57) ABSTRACT

There are provided a highly reliable semiconductor device capable of suppressing occurrence of cracks as well as securing flatness and a manufacturing method therefor. The semiconductor device includes: a semiconductor substrate; an element region; and a non-element region. The non-element region includes: a top-layer metal wiring in a top layer of metal wirings formed in the non-element region; a flattening film covering an upper surface of the top-layer metal wiring; and a protecting film formed over the flattening film. A removed part where the protecting film is removed is formed in at least part of the non-element region.

20 Claims, 26 Drawing Sheets

(56) References Cited

FOREIGN PATENT DOCUMENTS

| JP | 7-14806 A | 1/1995 |
| JP | 11-251458 A | 9/1999 |
| JP | 2001-210609 A | 8/2001 |
| JP | 2004-303784 A | 10/2004 |
| JP | 2007-173325 A | 7/2007 |
| JP | 2008270720 A | 11/2008 |
| JP | 2009188068 A | 8/2009 |
| JP | 2009-239149 A | 10/2009 |
| JP | 2010-187036 A | 8/2010 |
| JP | 2011138856 A | 7/2011 |
| JP | 2011222939 A | 11/2011 |
| JP | 2011238652 A | 11/2011 |
| JP | 2012186396 A | 9/2012 |

* cited by examiner

SEMICONDUCTOR DEVICE AND MANUFACTURING METHOD OF THE SAME

CROSS-REFERENCE TO RELATED APPLICATIONS

The disclosure of Japanese Patent Application No. 2012-262828 filed on Nov. 30, 2012 including the specification, drawings and abstract is incorporated herein by reference in its entirety.

BACKGROUND

The present invention relates to semiconductor devices and manufacturing methods of the semiconductor devices and in particular to a semiconductor device having a flattening film and a manufacturing method for the same.

A semiconductor devices formed in a matrix pattern in a main surface of a semiconductor wafer is divided into respective semiconductor devices (semiconductor chips) by a process called dicing. If a region where the semiconductor wafer is cut by the dicing has a nitride film etc. as a passivation film, cracks or chipping may occur in the nitride film during the cutting. Since the cracks starting from the cut region advance toward each cut semiconductor chip, the semiconductor chip after being divided may have a crack problem.

In order to suppress the crack problem, it is considered effective to form a slot etc. in a region where dicing is performed or in its vicinity to suppress the progress of the cracks. The technology to form slots in the region where the dicing is performed or in its vicinity is disclosed in each of the following patent documents.

[Patent Document 1]
Japanese Unexamined Patent Publication No. 2001-210609
[Patent Document 2]
Japanese Unexamined Patent Publication No. 2004-303784
[Patent Document 3]
Japanese Unexamined Patent Publication No. 2007-173325
[Patent Document 4]
Japanese Unexamined Patent Publication No. Hei 7 (1995)-14806
[Patent Document 5]
Japanese Unexamined Patent Publication No. 2010-187036
[Patent Document 6]
Japanese Unexamined Patent Publication No. 2009-239149
[Patent Document 7]
Japanese Unexamined Patent Publication No. Hei 6 (1994)-77315
[Patent Document 8]
Japanese Unexamined Patent Publication No. Hei 11 (1999)-251458

SUMMARY

In particular, when a semiconductor device has, for example, a CMOS (Complementary Metal Oxide Semiconductor) image sensor, it is necessary to make flatter the laminated structure on a metal wiring of the uppermost layer of the semiconductor device. However, if a level difference between the region in which a slot is formed and the region in which a slot is not formed becomes large by forming the above slot etc., the flatness of the laminated structure on the metal wiring of the uppermost layer is degraded. It is to be noted that the above patent documents do not include a particular configuration for suppressing occurrence of cracks and, at the same time, securing flatness of the upper layer of the laminated structure.

Other objects and novel features of the invention will be apparent from the description herein and accompanying drawings.

According to one embodiment, a semiconductor device includes: a semiconductor substrate; an element region; and a non-element region. The non-element region includes: a top-layer metal wiring in a top layer of metal wirings formed in the non-element region; a flattening film covering an upper surface of the top-layer metal wiring; and a protecting film formed over the flattening film. A removed part where the protecting film is removed is formed in at least part of the non-element region.

In another embodiment, according to a method for manufacturing a semiconductor device, first, a semiconductor substrate having a main surface is provided. An element region and a non-element region are formed. There are formed, in the non-element region, a top-layer metal wiring in a top layer of metal wirings formed in the above non-element region, a flattening film covering an upper surface of the top-layer metal wiring, and a protecting film formed over the flattening film. There is also formed a removed part where the protecting film is removed such that the flattening film remains over the upper surface of the top-layer metal wiring in the non-element region.

According to one embodiment and other embodiments, it is possible to provide a semiconductor capable of securing flatness of a laminated structure and suppressing occurrence of cracks.

DETAILED DESCRIPTION

Hereinafter, description will be given to one embodiment of the invention with reference to drawings.

First Embodiment

Now, referring to FIG. 1, description will be given to a semiconductor device in a wafer state as one embodiment.

Figure 1:
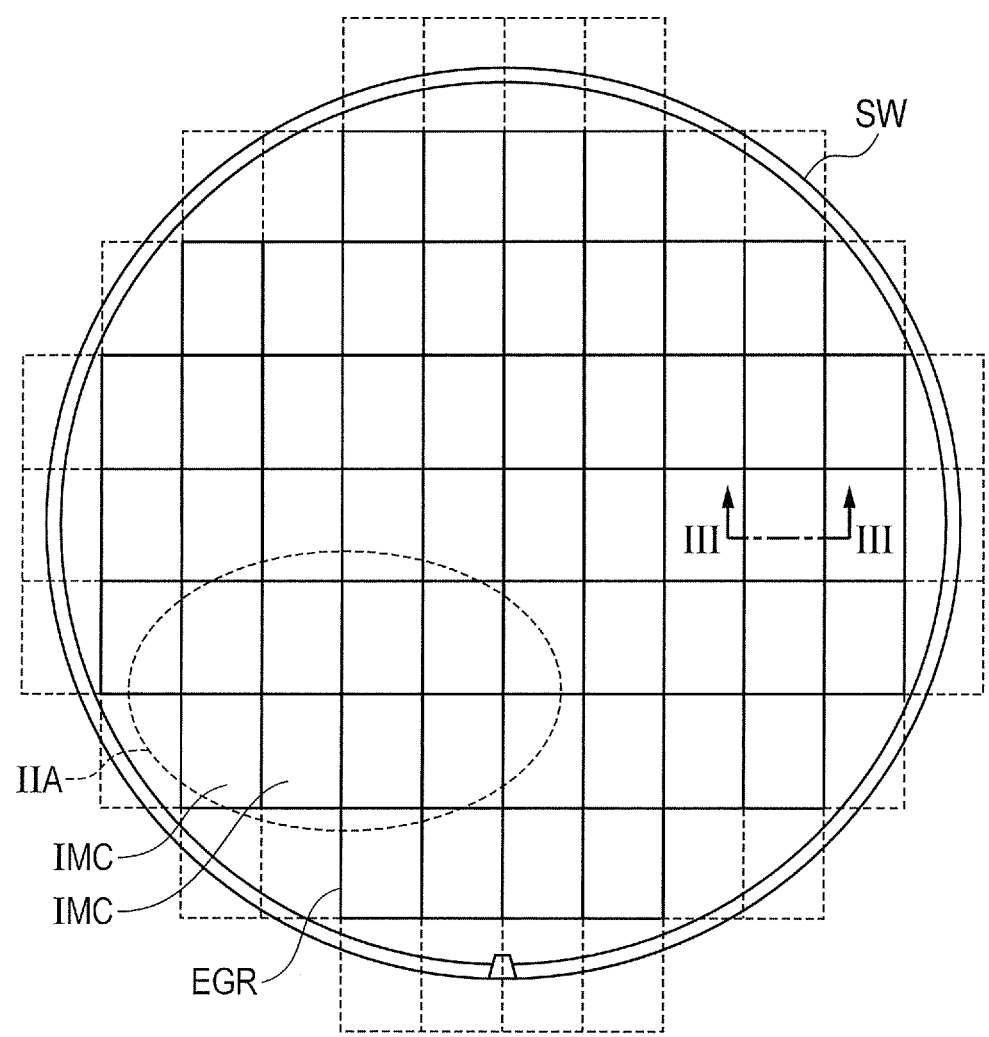
FIG. 1 is a schematic plan view showing a state of a wafer for forming a semiconductor device according to one embodiment.

Referring to FIG. 1, a semiconductor wafer SW is comprised of, for example, a silicon single crystal. A plurality of chip regions IMC for image sensor are arranged over a main surface of the semiconductor wafer SW. Each of the chip regions IMC for image sensor has a rectangular planar shape, and they are arranged in a matrix pattern. A region between a pair of adjacent chip regions IMC over the main surface of the semiconductor wafer SW is an edge region EGR (non-element region). The edge region EGR has a rectangular shape surrounding a circumference of the chip region IMC, and separating each of the multiple chip regions IMC over the main surface of the semiconductor wafer SW. Further, near the circumference of the semiconductor wafer SW of FIG. 1, in a region surrounded by a broken line and the edge region EGR, part of the rectangle as the chip region is cut away by an outer edge of the semiconductor wafer SW. This region may have a configuration, in which elements for image sensor are arranged, similar to that of the chip region IMC.

Figure 2A:
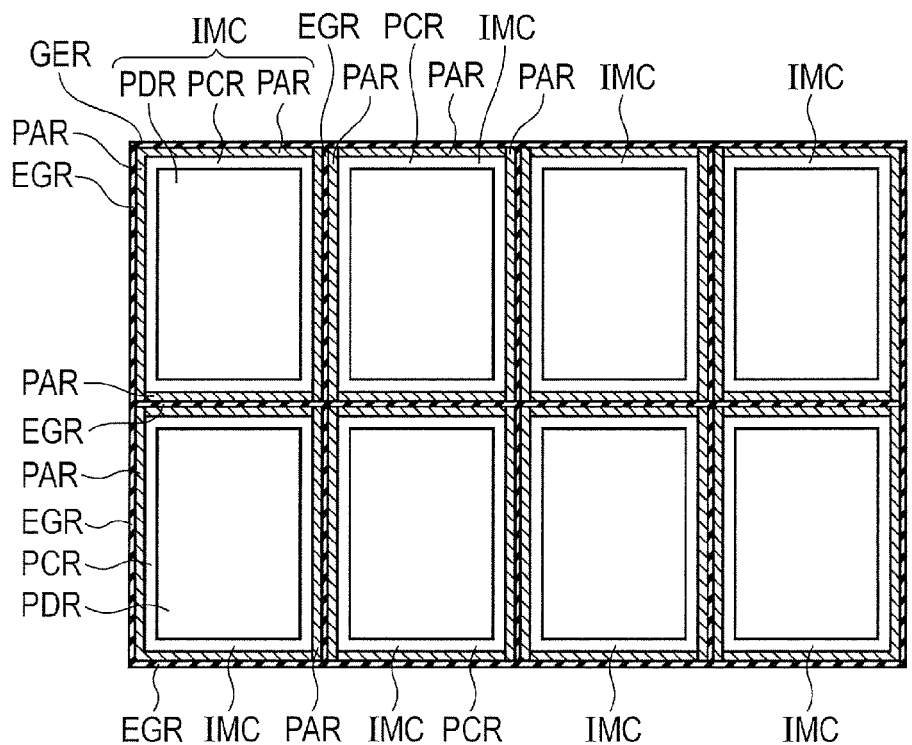
FIG. 2A is an enlarged schematic plan view showing a region IIA surrounded by an oval broken line in FIG. 1.

Next, referring to FIG. 2, description will be given to the chip region IMC and the edge region EGR in FIG. 1. Referring to FIG. 2A, each of the chip regions IMC arranged over the semiconductor wafer SW has: a photodiode region PDR (element region); a peripheral circuit region PCR; and a pad formation region PAR. The photodiode region PDR is a region where a plurality of photodiodes as photoelectric conversion elements (photodetectors) are arranged, for example, in a matrix pattern. The peripheral circuit region PCR is a region where a peripheral circuit for controlling the photodiode in the photodiode region PDR is formed. The pad formation region PAR is a region where, for example, a pad being a rectangular conductive thin film can be disposed such that the pad serves as an electrode to drive photodiodes in the photodiode region PDR, a control element in the peripheral circuit region PCR, and so on.

Figure 2B:
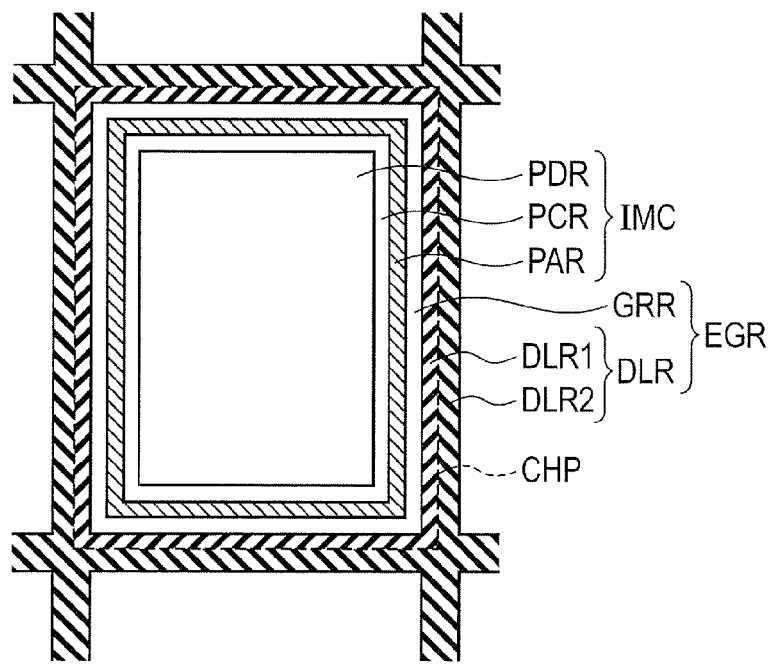
FIG. 2B is an enlarged schematic plan view showing, in more detail, while being cut, particularly of FIG. 2A, a region being formed as a single semiconductor chip.

Referring to FIGS. 2A and 2B, the photodiode region PDR is arranged such that, in a plan view, it has a rectangular plane shape in a central part of the chip region IMC. Also, the peripheral circuit region PCR is arranged, in a plan view, so as to surround a circumference of the photodiode region PDR. Moreover, the pad formation region PAR is so arranged, in a plan view, as to surround a circumference of the peripheral circuit region PCR.

On the other hand, particularly referring to FIG. 2B, the edge region EGR has a guard ring region GRR and a dicing line region DLR. The guard-ring region GRR is so arranged, in a plan view, as to surround a circumference of the chip region IMC (pad formation region PAR). Also, the dicing line region DLR is so arranged, in a plan view, as to surround a circumference of the guard ring region GRR.

As will be described later, in the guard ring region GRR, there is formed a guard ring being a laminated structure of metal wirings so arranged as to surround the circumference of the chip region IMC (photodiode region PDR). By having the guard ring, the guard ring region GRR plays a role of protecting the photodiode in the chip region IMC (photodiode region PDR) from external moisture etc.

In the semiconductor wafer SW, the dicing line region DLR is located among a plurality of chip regions IMC. In the dicing line region DLR, an alignment mark etc. are arranged. In the dicing line region DLR, when the semiconductor wafer SW is cut (diced) at a broken line shown in FIG. 2B, the semiconductor wafer SW is divided into a plurality of semiconductor chips CHP having the chip region IMC and the edge region EGR.

The semiconductor chip CHP located in the center of FIG. 2B is configured such that, when the dicing line region DLR is divided into a dicing line region DLR1 and a dicing line region DLR2, the dicing line region DLR1 is arranged as part of the edge region EGR. Moreover, the chip region IMC arranged on the right-hand side of the semiconductor chip CHP in the central part of FIG. 2B is configured such that the dicing line region DLR2 made by the division with use of the above dicing is arranged as part of the edge region EGR.

In FIG. 2, in particular, the photodiode region PDR is shown smaller than it actually is. Also, regions except the photodiode region PDR are shown larger than they actually are. Therefore, the dimension of each region may differ greatly from its actual dimension. Specifically, it is preferred that the dicing line region DLR has a width (a width in a direction intersecting with a direction extending so as to form a rectangle in a plan view which is 60 μm or greater but not greater than 120 μm when combining the dicing line region DLR1 and the dicing line region DLR2. It is preferred that a width of a region (so-called blade width) where the dicing region is actually cut with an edged tool during dicing is about half the width of the above dicing line region DLR. Specifically, the width is preferably, for example, 30 μm or more but 60 μm or less.

Next, referring to FIG. 3, the configuration of each part of the semiconductor chip CHP of one embodiment will be described.

Figure 3:
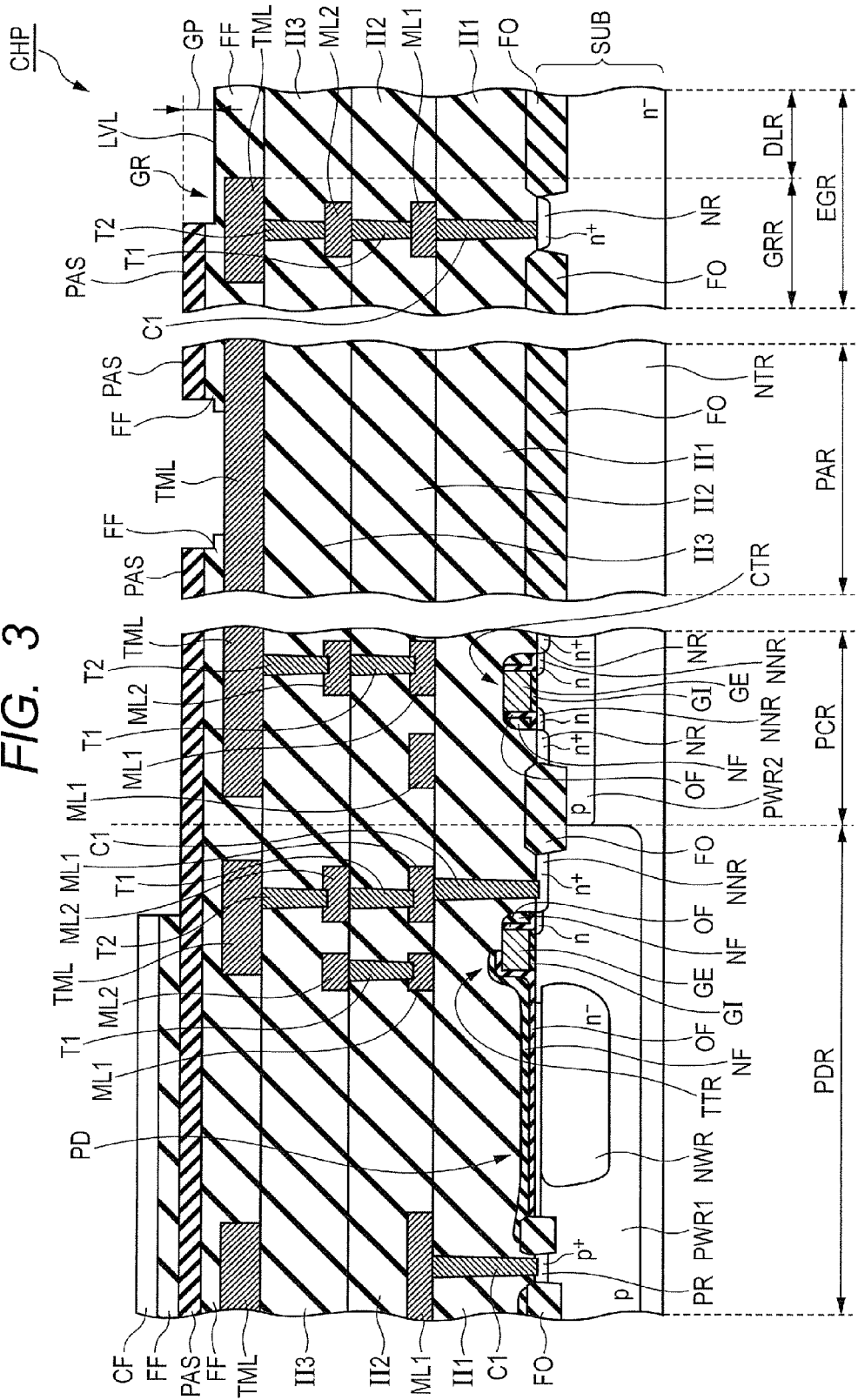
FIG. 3 is a schematic cross-sectional view showing a configuration of each region of the semiconductor chip whose portion along line III-III in FIG. 1 is cut according to one embodiment.

Referring to FIG. 3, for example, the semiconductor chip CHP for image sensor according to one embodiment has: a photodiode PD (photodetector) of the photodiode region PDR; and a transistor CTR for controlling a peripheral circuit region PCR.

Specifically, the semiconductor chip CHP is formed, for example, in an n-region NTR of a semiconductor substrate SUB (which is the same as the substrate of the semiconductor wafer SW) comprised of silicon. The photodiode region PDR and the peripheral circuit region PCR are separated from each other, in a plan view, by a field oxide film FO formed in the surface of the semiconductor substrate SUB. As for other regions adjacent to each other also, they may be separated, in a plan view, by the field oxide film FO formed in the surface of the semiconductor substrate SUB. For example, the field oxide films FO described above are arranged also in the pad formation region PAR and in the edge region EGR, and the field oxide films FO in respective regions are formed as the same layer.

The photodiode PD is formed in the semiconductor substrate SUB of the photodiode region PDR, and is comprised of a p-type well region PWR1 and an n-type impurity region NWR. The p-type well region PWR1 is formed in the surface of the semiconductor substrate SUB in the photodiode region PDR. The n-type impurity region NWR is formed in the surface of the semiconductor substrate SUB in the p-type well region PWR1, and forms a p-n junction with the p-type well region PWR1.

In the photodiode region PDR, a MIS (Metal Insulator Semiconductor) transistor, such as a transfer transistor TTR, is also formed. Particularly, the transfer transistor TTR includes a pair of a source/drain regions NWR and NNR, NR, a gate insulating film GI, and a gate electrode GE. The pair of n-type source/drain regions NWR and NNR, NR are placed over the surface of the semiconductor substrate SUB in the p-type well region PWR1 at a distance from each other. One region of the pair of n-type source/drain regions NWR and NNR, NR is integrated with the n-type impurity region NWR of the photodiode PD and they are electrically coupled with each other. The other region of the pair of source/drain regions NWR and NNR, NR includes a $n^+$ impurity region NR as a high-concentration region and an n-type impurity region NRR as LDD (Lightly Doped Drain). The gate electrode GE is formed over the surface of the semiconductor substrate SUB sandwiched between the pair of source/drain regions NWR and NNR, NR with the gate insulating film GI in between.

Moreover, a $p^+$ impurity region PR is formed in the surface of the semiconductor substrate SUB in the p-type well region PWR1 so that the surface of the semiconductor substrate SUB is coupled with an upper wiring.

An insulating layer made by laminating a silicon nitride film NF and a silicon oxide film OF in this order is formed over the surface of the semiconductor substrate SUB so as to cover the photodiode PD. One end of this insulating layer runs onto the gate electrode GE on one side. As the residue of the above insulating layer, a sidewall insulating layer made up of the silicon nitride film NF and the silicon oxide film OF laminated in this order likewise is formed over the sidewall of the gate electrode GE on the other side.

For example, a p-type well region PWR2 is formed in the surface of the semiconductor substrate SUB in the peripheral circuit region PCR. In this p-type well region PWR2, there is formed a controlling element for controlling the operations of a plurality of photodiodes PD and this controlling element includes, for example, a MIS transistor CTR.

The MIS transistor CTR includes a pair of n-type source/drain regions NNR, NR, a gate-insulating GI, and a gate electrode GE. The pair of n-type source/drain regions NNR, NR are formed in the surface of the semiconductor substrate SUB at a distance from each other. Each of the pair of n-type source/drain regions NNR, NR includes, for example, an n-type impurity region NR as a high-concentration region and an n-type impurity region NNR as LDD.

The gate electrode GE is formed over the surface of the semiconductor substrate SUB sandwiched between the pair of n-type source/drain regions NNR, NR with the gate insulating film GI in between. A sidewall insulating layer made by laminating a silicon nitride film NF and a silicon oxide film OF in this order is formed over the sidewall of a gate electrode GE.

The gate electrode GE of each MIS transistor in the photodiode region PDR and the peripheral circuit region PCR may be comprised of polycrystalline silicon doped with an impurity. Alternatively, it may be formed of, for example, a metal such as titanium nitride (TiN).

An $n^+$ impurity region NR is formed in the surface of the semiconductor substrate SUB in the guard ring region GRR of the edge region EGR. Like the $p^+$ impurity region PR in the photodiode region PDR, the $n^+$ impurity region NR is formed for coupling with the upper-layer wiring.

An interlayer insulating layer II1 is formed over the surface of the semiconductor substrate SUB so as to cover the above elements (the photodiode PD and the MIS transistors TTR, CTR) in each of the chip regions IMC (the photodiode region PDR, the peripheral circuit region PCR, and the pad formation region PAR) and the edge region EGR (the guard ring region GRR and the dicing line region DLR). In the photodiode region PDR, the peripheral circuit region PCR, and the guard ring region GRR, a patterned first-layer metal wiring ML1 is formed over the interlayer insulating layer II1. This first-layer metal wiring ML1 is electrically coupled to, for example, a $p^+$ impurity region PR or an $n^+$ impurity region NR through a conductive layer C1 filled in contact holes in the interlayer insulating layer II1.

An interlayer insulating layer II2 is formed over the interlayer insulating layer II1 so as to cover the metal wiring ML1. In the photodiode region PDR, the peripheral circuit region PCR, and the guard-ring region GRR, a patterned second-layer metal wiring ML2 is formed over the interlayer insulating layer II2. The second-layer metal wiring ML2 is electrically coupled with the first-layer metal wiring ML1 through a conductive layer T1 filled in through holes in the interlayer insulating layer II2.

An interlayer insulating layer II3 is formed over the interlayer insulating layer II2 so as to cover the metal wiring ML2. In the photodiode region PDR, the peripheral circuit region PCR, and the guard ring region GRR, a patterned third-layer metal wiring TML is formed over the interlayer insulating layer II3. Of the metal wirings formed in the chip region IMC and the edge region EGR, the metal wiring TML is a wiring formed in a top layer. The top-layer metal wiring TML in the third layer is electrically coupled with the second-layer metal wiring ML2 through a conductive layer T2 filled in through holes in the interlayer insulating layer II3.

The metal wirings of three layers in total including the top-layer metal wiring TML are laminated in FIG. 3. However, the number of the metal wirings to be laminated is not limited to this but can be a given number. It is preferred that the top-layer metal wiring TML and the metal wirings ML1 and ML2 be formed of a metal material such as aluminum. Alternatively, it may be formed of a metal material such as copper. Further, the interlayer insulating layers II1, II2, and II3 are comprised of, for example, a silicon oxide film and formed of a material different in etching selectivity from those of the metal wirings ML1 and ML2 (the etching selectivity is etching selectivity used, for example, when the interlayer insulating layers II2 and II3 are etched to form conductive layers T1 and T2). Furthermore, it is preferred that through holes, formed in the interlayer insulating layer, for the conductive layers C1, T1, and T2 be filled with metal material, such as tungsten. Although not shown, the sidewall or bottom wall of the through holes for the conductive layers C1, T1, and T2 may be covered with barrier metal.

Particularly in the photodiode region PDR of the chip region IMC, metal wirings ML1, ML2, and TML electrically coupled with one another by the conductive layers C1, T1, and T2 are electrically coupled with one region of the pair of n-type source/drain regions NWR and NNR, NR of the transfer transistor TTR. On the other hand, particularly in the guard ring region GRR of the edge region EGR, the guard ring GR is formed by the metal wirings ML1, ML2 and TML, and the conductive layers C1, T1, and T2 electrically coupling the metal wirings ML1, ML2, and TML with one another. This guard ring GR is arranged so that it may extend immediately above the n$^+$ impurity region NR in a vertical direction in FIG. 3. Also, the guard ring GR is formed so as to extend along the guard ring region GRR, in a plan view, that is, to surround the chip region IMC in the shape of a rectangle in a plan view.

As a result, the guard ring GR functions as a wall surface which prevents foreign matters entering the inside (the chip region IMC etc. surrounded by the guard ring) of the guard ring GR in the laminated structure including the interlayer insulating layers II1 to II3 from the outside (outside of the region surrounded by the guard ring GR) of the guard ring GR. Specifically, as described above, for example, the wall surface of the guard ring GR prevents moisture etc. from entering the inside of the region surrounded by the guard ring GR from the outside of the region surrounded by the guard ring GR.

Moreover, the top-layer metal wiring TML in the pad formation region PAR is, for example, a rectangular conductive thin film formed as the above electrode.

In addition, in the photodiode region PDR, the metal wirings ML1, ML2, and TML are not disposed immediately above the photodiode PD in particular. With the above structure, it becomes easier for light to enter the photodiode PD from the above in FIG. 3.

So as to cover the top-layer metal wiring TML, a flattening film FF is formed over the interlayer insulating layer II3. The flattening film FF is formed in the photodiode region, the peripheral circuit region PCR, the pad formation region PAR, and the edge region EGR. The flattening film FF is comprised of, for example, a silicon oxide film and is formed by the forming method similar to that of the interlayer insulating layers II1 to II3, such that it is as thick as the interlayer insulating layers II1 to II3.

In the photodiode region PDR and the peripheral circuit region PCR, the flattening film FF is formed substantially all over the surface such that the height of an upper surface thereof (distance in a vertical direction in FIG. 3 from the main surface of the semiconductor substrate SUB of the upper surface) is almost even. That is, the thickness of the flattening film FF in each region is substantially the same. In the pad formation region PAR, the flattening film FF is so formed as to cover a region (a region near the outer edge, in a plan view) of part of the top-layer metal wiring TML being a pad, for example. Further, the flattening film FF is so formed as not to cover the region (the central part, in a plan view) except the regions of the above part of the top-layer metal wiring TML (pad). That is, in the above central part, in a plan view, the top-layer metal wiring TML is exposed.

Moreover, at the end portion on the central part side, in a plan view, for example, the flattening film FF in the pad formation region PAR is thinner as compared to those in other regions, and may have a step-like cross section. Specifically, of the pad formation region PAR, the thickness of flattening film FF in the region except for the edge portion on the above central side is substantially the same as the thickness of the flattening film FF in the photodiode region PDR and the peripheral circuit region PCR. Of the pad formation region PAR, the flattening film FF at the edge on the above central part side is thinner than the flattening film FF in the photodiode region PDR etc.

In the edge region EGR, the flattening film FF is so formed as to cover the upper surface of the top-layer metal wiring TML forming the guard ring GR in the guard ring region GRR. That is, the upper surface of the flattening film FF is located above (the other side of the top-layer metal wiring TML opposed to the semiconductor substrate SUB) the upper surface of the top-layer metal wiring TML forming the guard ring GR.

Outside (the other side of the guard ring region GRR opposed to the photodiode region PDR and right-hand side in FIG. 3) of the guard ring region GRR and in the dicing line region DLR, as compared to the inside (a side opposed to the photodiode region PDR and is on the left-hand side in FIG. 3) of the guard ring region GRR, the flattening film FF is thinner. In a region overlapping the top-layer metal wiring TML of the guard ring GR, in a plan view, also, at a part thereof (the right-hand side in FIG. 3), the flattening film FF is thinner as compared to those in other regions. In the region where the flattening film FF is thinner also, the flattening film FF covers the upper surface of the top-layer metal wiring TML. That is, the flattening film FF covers substantially all the surface of the top-layer metals wiring TML in the edge region EGR.

Of the edge region EGR, the thickness of the flattening film FF in a region where the above flattening film FF is thinner is, for example, substantially the same as the thickness of the flattening film FF in a region (central part in a plan view) where the flattening film FF is thinner in the pad formation region PAR. Moreover, of the edge region EGR, the thickness of the flattening film FF in the region where the flattening film FF is thick is substantially equal to the thickness of the flattening film FF in the photodiode region PDR and the peripheral circuit region PCR.

Over the flattening film FF, a passivation film PAS (protecting film) is formed. The passivation film PAS is comprised of, for example, a silicon nitride film, and serves to protect each layer on the side (lower side in FIG. 3) closer to the semiconductor substrate SUB than the passivation film PAS from moisture etc.

In the photodiode region PDR and the peripheral circuit region PCR, the passivation film PAS is formed substantially all over the flattened film FF such that the thickness thereof is substantially even. In the pad formation region PAR and the edge region EGR, the passivation film PAS is formed so as to cover the region whose flattening film FF immediately below is thick. The passivation film PAS is not formed in other regions.

In each of the photodiode region PDR, the peripheral circuit region PCR, the pad formation region PAR, and the edge region EGR, in a region where the passivation film PAS is formed, the thickness of the passivation film PAS and the thickness of the flattening film FF immediately below are substantially even. However, in the pad formation region PAR and the edge region EGR, in a region where the passivation film PAS is not formed, the upper surface of the top-layer metal wiring TML immediately below or the upper surface of the flattening film FF is exposed.

In this regard, attention is paid, in particular, to the edge region EGR as a non-element region. Particularly, on the right-hand side in FIG. 3, the passivation film PAS is not formed immediately above the region where the flattening film FF is thinner than other regions. That is, the passivation film PAS is removed. The region (removed part) where the passivation film PAS is removed forms a level difference LVL with respect to the adjacent region where the passivation film PAS is formed.

A volume of the level difference LVL (level difference volume GP) in the edge region EGR means a difference in height in a thickness direction of the semiconductor substrate SUB particularly between the upper surface of the passivation film PAS and an upper surface of the flattening film FF in the level difference LVL of the edge region EGR (or other regions, such as the photodiode region PDR).

As described above, in the edge region EGR, the bottom face of the level difference LVL (upper surface of the flattening film FF in the level difference LVL) is located above the upper surface of the top-layer metal wiring TML, in FIG. 3, configuring the guard ring GR. Therefore, in FIG. 3, the upper surface of the top-layer metal wiring TML of the edge region EGR is not exposed but the upper surface only of the top-layer metal wiring TML in the pad formation region PAR is exposed.

Above the photodiode region PDR, in particular, immediately above the photodiode PD, the flattening film FF and a color filter CF are laminated in this order over the passivation film PAS. This flattening film FF is, like the flattening film FF over the above interlayer insulating layer II3, preferably formed of, for example, a silicon oxide film. Further, the color filter CF is preferably formed of a publicly known organic material or an inorganic material. Although not shown, over the color filter CF, there is formed a condensing lens for allowing desired light to enter the photodiode PD with high efficiency.

Referring to FIGS. 4 to 8, description is given to a manufacturing method of the semiconductor device of one embodiment. Hereafter, in order to omit a detailed description of the method for forming the interlayer insulating layer II3 and each layer below the interlayer insulating layer II3 shown in FIG. 3, each layer in FIGS. 4 to 8 shown has been simplified in comparison.

Figure 4:
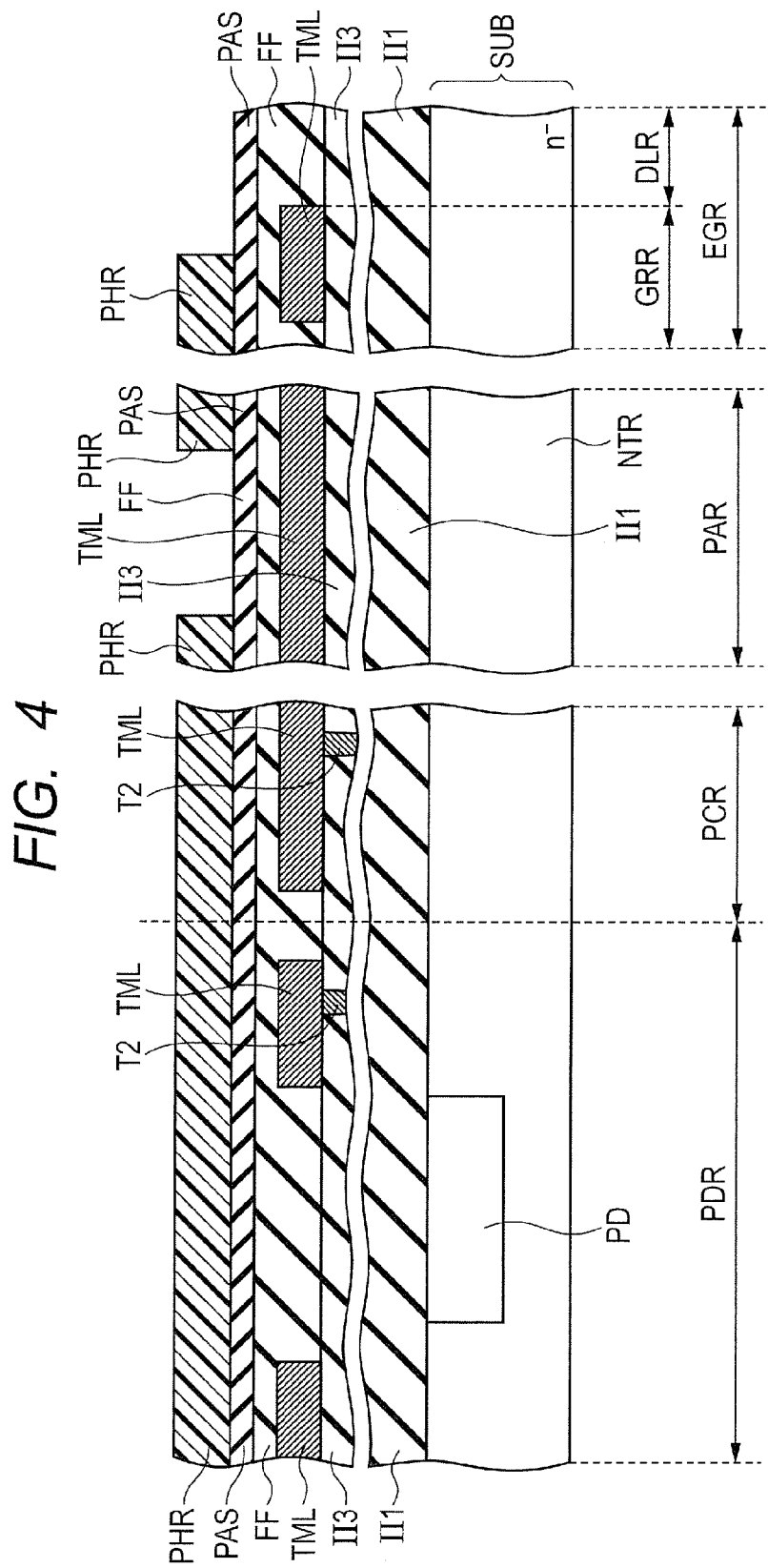
FIG. 4 is a schematic cross-sectional view illustrating a first step of a manufacturing method of a semiconductor device according to a first embodiment.

Referring to FIG. 4, there is provided a semiconductor substrate SUB (semiconductor wafer SW: see FIG. 1) formed of different semiconductor materials such as silicon and germanium according to the light wavelength applied when in use. There are formed, over the main surface thereof, a photodiode PD, interlayer insulating layers II1 to II3, metal wirings ML1 and ML2, conductive layers T1 and T2, etc., as shown in FIG. 3. The above regions are formed by a publicly known method. Accordingly, the main surface of the semiconductor substrate SUB is separated into: a chip region IMC (see FIG. 2) including a photodiode region PDR where the photodiode PD is formed, a peripheral circuit region PCR where the above transistor CTR for control etc. are formed, and a pad formation region PAR; and an edge region EGR outside the chip region.

So as to cover an upper surface of the interlayer insulating layer II3, a metal wiring TML is formed, for example, by sputtering and, then, patterned into a shape as shown in FIG. 4 by ordinary photoengraving process and etching process. The metal wiring TML serves as a top-layer metal wiring TML and is formed in each of the photodiode region PDR, the peripheral circuit region PCR, the pad formation region PAR, and the edge region EGR.

Next, in each region including the edge region EGR, so as to cover the upper surface of the top-layer metal wiring TML, a flattening film FF is formed over the interlayer insulating layer II3. As in the case of the interlayer insulating layers II1 to II3, the flattening film FF is formed, for example, by a related-art CVD (Chemical Vapor Deposition) method. Further, the flattening film FF is formed such that, substantially all over each region including an edge region EGR, it has substantially an even film thickness and its upper surface is substantially flat. On the other hand, the flattening film FF is so formed as to cover both the upper surfaces of the interlayer insulating layer II3 and the top-layer metal wiring TML located above. It is preferred that the flattening film FF be thicker enough than the top-layer metal wiring TML to achieve above embodiment.

Next, substantially all over the surface of the flattening film FF in each region including the edge region EGR, a passivation film PAS is formed by, for example, a related-art CVD method.

Next, for example, by ordinary photoengraving process using a so-called positive type photo resist PHR, a pattern of the photoresist PHR having an opening in a region from which the passivation film PAS is to be removed is formed. In this regard, the positive type photoresist PHR means a photoresist whose exposure portion becomes fusible by a developing solution.

Figure 5:
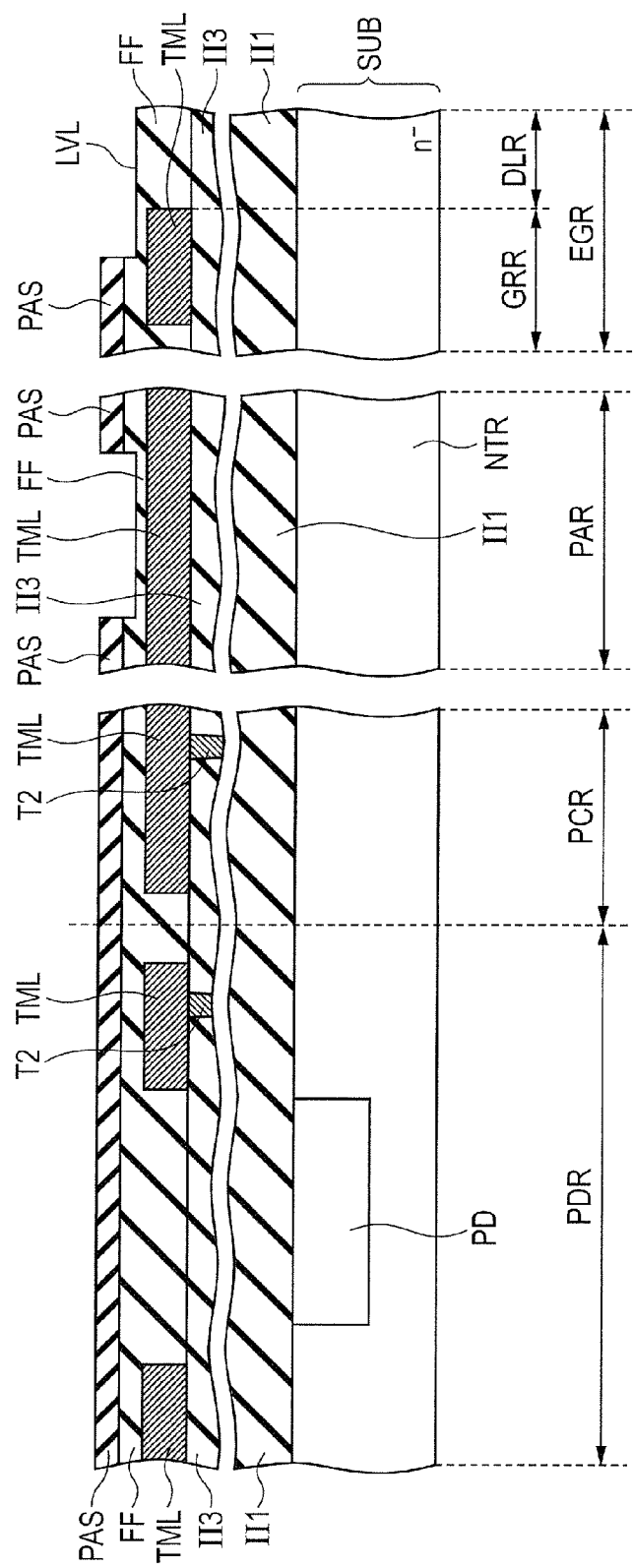
FIG. 5 is a schematic cross-sectional view illustrating a second step of a manufacturing method of a semiconductor device according to the first embodiment.

Referring to FIG. 5, the passivation film PAS is patterned by ordinary etching process using the pattern of the photoresist PHR, and passivation films PAS of part of the pad formation region PAR (a central part, in a plan view) and part of the edge region EGR (a side far from the photodiode region PDR in the guard ring region GRR and the dicing line region DLR) are removed.

In the region where the passivation film PAS is removed, all the passivation film PAS is removed and the flattening film FF immediately below is exposed. Also, by being subjected to over-etching, since the flattening film FF immediately below is affected by the etching, part of the flattening film FF immediately below is removed. For this reason, as compared to the region where the passivation film PAS is not removed, in the region where the assivation film PAS is removed, there is formed a level difference LVL as a removed part of the passivation film PAS where the whole thickness becomes thinner by a sum of the thickness of the passivation film PAS and the thickness becomes thinner by a sum of the thickness of the passivation film PAS and the thickness of the flattening film FF immediately below to be over-etched.

It is preferred that the flattening film FF be over-etched to such an extent that the flattening film FF does not reach an upper surface of the top-layer metal wiring TML. That is, the upper surface of the flattening film FF being a bottom face of the level difference LVL to be formed is so formed as to be located above (the other side of the upper surface of the top-layer metal wiring TML opposed to the semiconductor substrate SUB) the upper surface of the top-layer metal wiring TML. In this regard, the passivation film PAS is removed by etching such that the flattening film FF remains substantially all over the surface, in a plan view, including the upper surface of the top-layer metal wiring TML in the edge region EGR, and the level difference LVL is formed.

Figure 6:
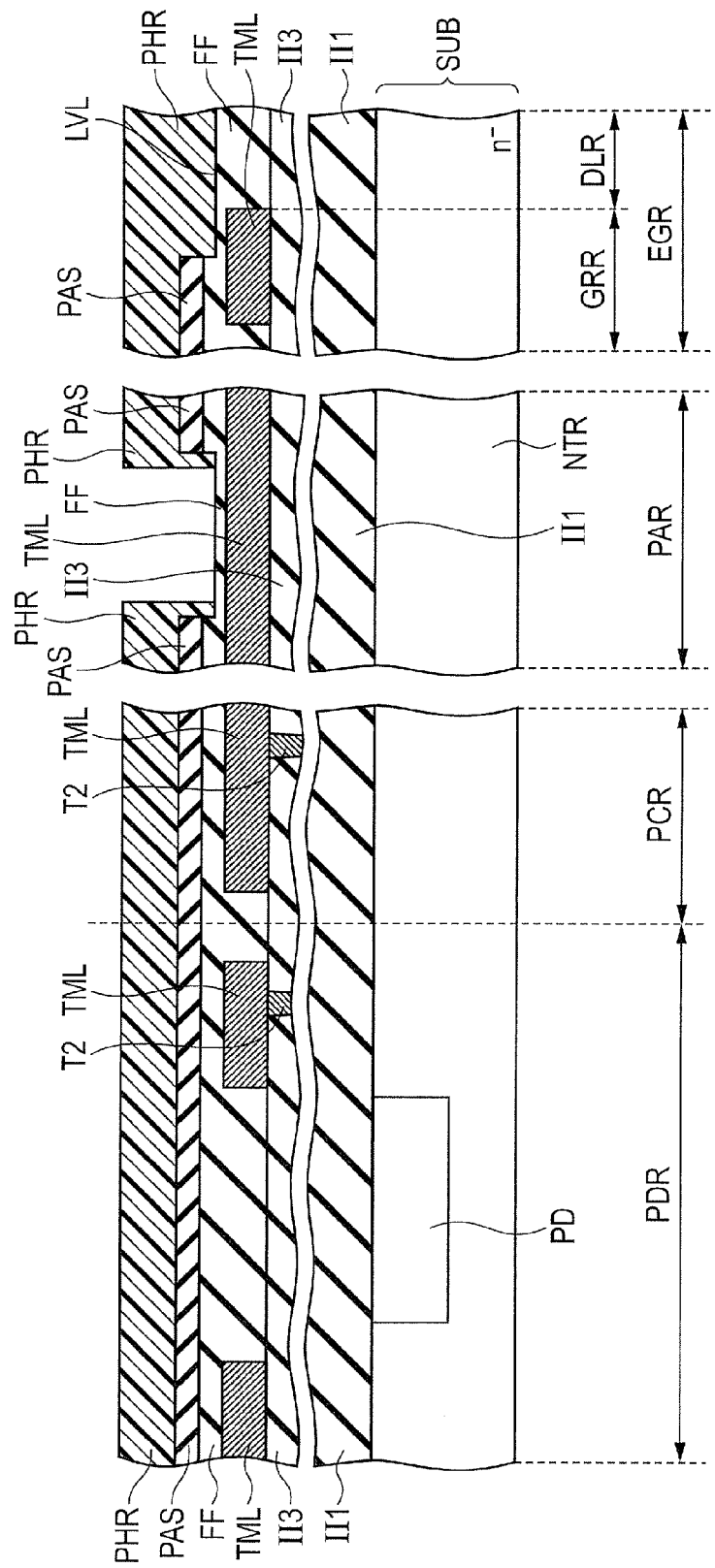
FIG. 6 is a schematic cross-sectional view illustrating a third step of a manufacturing method of a semiconductor device according to the first embodiment.

Referring to FIG. 6, for example, the ordinary photoengraving process using the positive type photoresist PHR, there is formed a pattern of the photoresist PHR having an opening in the central part, in a plan view, of the pad in the pad formation region PAR. The pattern of the photoresist PHR is preferably so formed as to cover substantially all over the surface of the photodiode region PDR, the peripheral circuit region PCR, and the edge region EGR.

Figure 7:
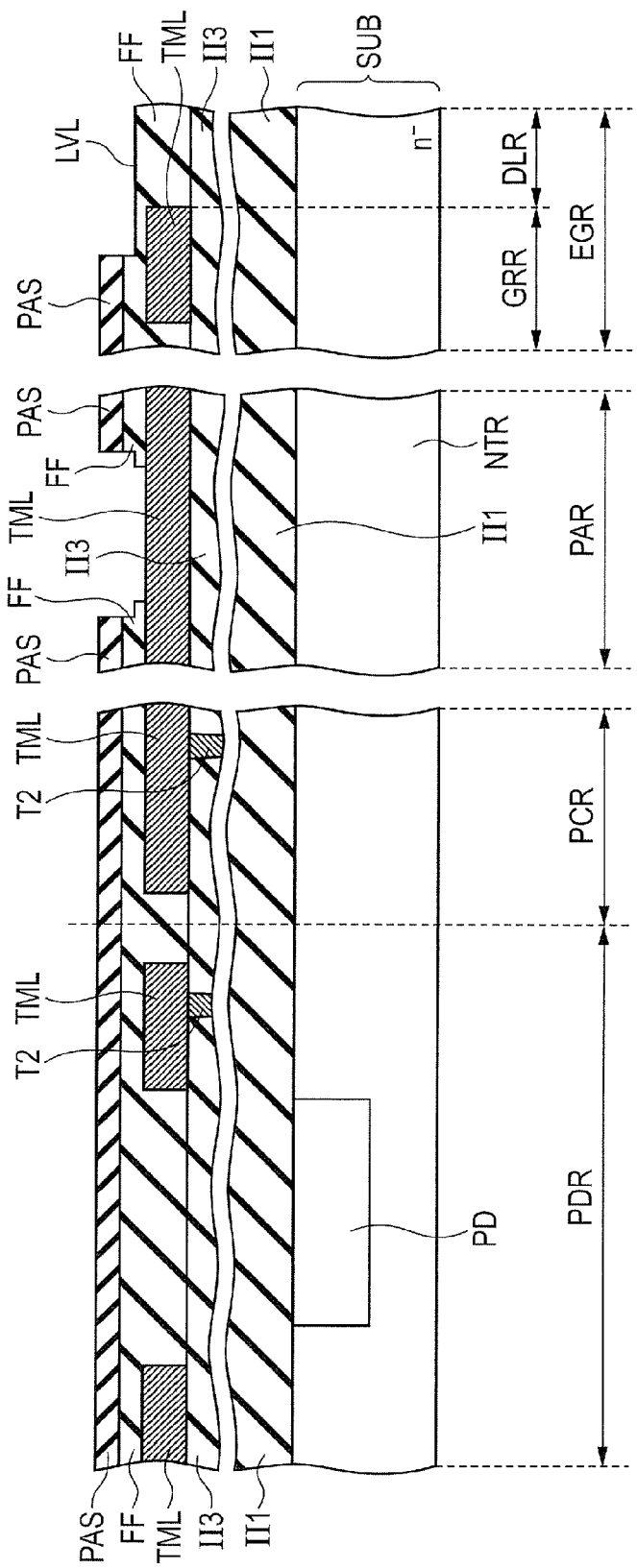
FIG. 7 is a schematic cross-sectional view illustrating a fourth step of a manufacturing method of a semiconductor device according to the first embodiment.

Referring to FIG. 7, by ordinary etching process using the pattern of the photoresist PHR, the flattening film FF in contact with an undersurface of the passivation film PAS is patterned, and a flattening film FF of the central part, in a plan view, of the pad formation region PAR is removed. According to this process, at the central part, in a plan view, of the pad formation region PAR, both the passivation film PAS and the flattening film FF are removed, and the upper surface of the top-layer metal wiring TML (pad) immediately below is exposed.

On the other hand, in the photodiode region PDR, the peripheral circuit region PCR, and the edge region EGR, the above etching is performed with substantially all the surfaces being covered with the photoresist PHR. For this reason, according to the steps shown in FIGS. 6 and 7, etching is not applied to the passivation films PAS and the flattening films FF in the photodiode region PDR, the peripheral circuit region PCR, and the edge region EGR. That is, the same condition, as in FIG. 5, of the level difference LVL in the edge region EGR is maintained. That is, in the edge region EGR, the flattening film FF left in the step of FIG. 5 still remains.

The opening of the photoresist PHR here is located at a position overlapping, in a plan view, with the opening of the photoresist PHR for etching the passivation film PAS in the pad formation region PAR. However, the opening of the photoresist PHR is somewhat smaller than that of the photoresist PHR for the passivation film PAS. For this reason, near an end portion of the opening of the passivation film PAS, a flattening film FF immediately below is not removed. As a result, the flattening film FF in the pad formation region has a somewhat thin region in the center (by over-etching of the passivation film PAS) and a thick region outside the thin region.

Figure 8:
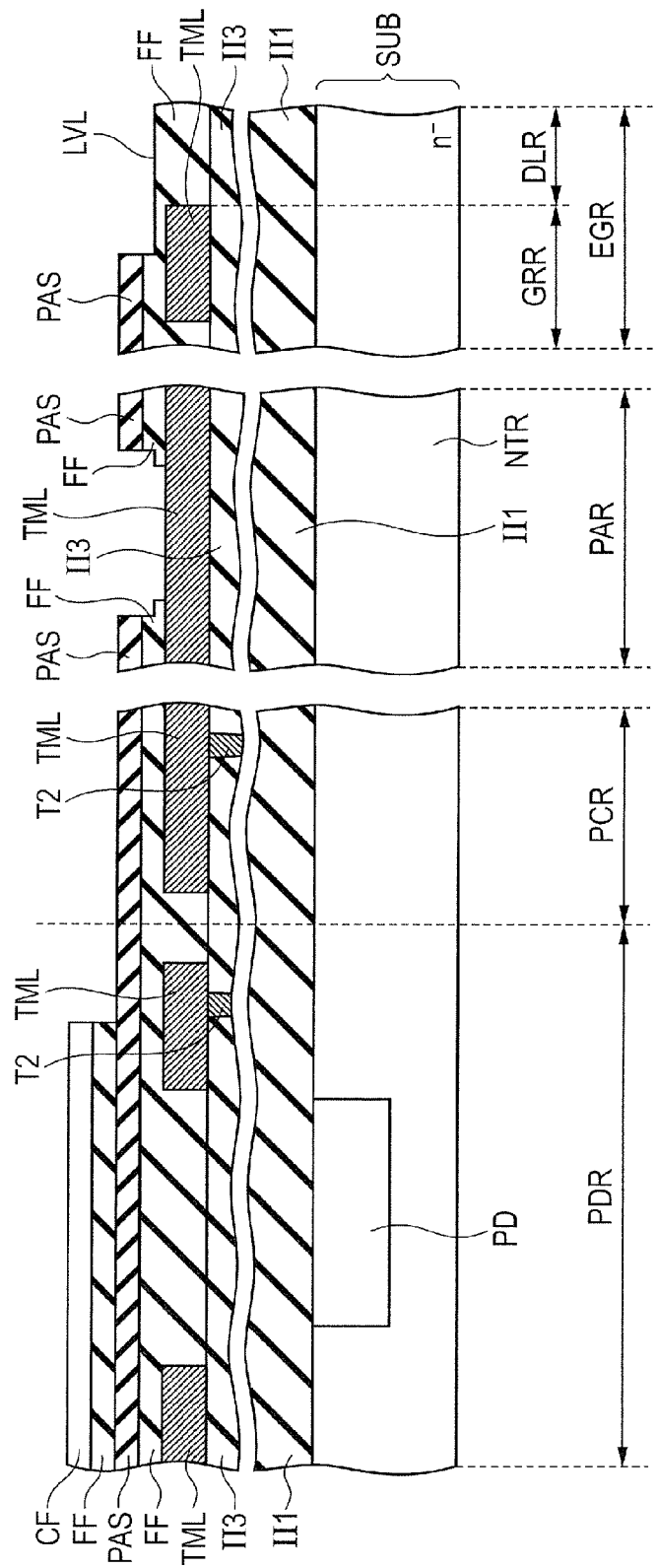
FIG. 8 is a schematic cross-sectional view illustrating a fifth step of a manufacturing method of a semiconductor device according to the first embodiment.

Referring to FIG. 8, by ordinary film forming process, photoengraving process, and etching process, the flattening film FF and the color filter CF are formed over the passivation film PAS immediately above the photodiode region PDR, in particular, immediately above the photodiode PD. The embodiment in FIG. 8 corresponds to the embodiment in each region shown in FIG. 3.

Although not shown, after this step, for example, over the color filter CF, there is formed a condensing lens for allowing desired light to enter the photodiode PD with high efficiency.

Accordingly, as shown in FIGS. 1 to 2, the above regions PDR, PCR, PAR, and EGR are repeatedly arranged in a matrix pattern over the main surface of the semiconductor wafer SW. By cutting this, as shown by a broken line in FIG. 2B, in the dicing line region DLR being part of the edge region EGR, a plurality of semiconductor chips CHP for image sensor having photodiodes PD are formed.

Next, the operation and effect of one embodiment will be explained. For example, in the dicing line region DLR, when the passivation film PAS is not removed and the removed part (level difference LVL) is not formed, the passivation film PAS is cut during the dicing of the semiconductor chip CHP of the semiconductor wafer SW. When the passivation film PAS is comprised of a silicon nitride film, the effect of the passivation film PAS as a protecting film particularly increases. At the same time, when the passivation film PAS is cut, the possibility of occurrence of cracks or chipping increases. This is because the silicon nitride film has high rigidity and is likely to have cracks. The cracks may advance toward the semiconductor chip CHP formed by the cutting and may cause the semiconductor chip CHP to have a crack problem.

In view of the above, if a level difference LVL is formed in the dicing line region DLR and the passivation film PAS is removed, it eliminates possibility of the occurrence of cracks and chipping (starting) being originated from the passivation film PAS (silicon nitride film) during dicing. As a result, occurrence of the crack problem and chipping problem is suppressed in the semiconductor chip CHP after dicing.

Next, from a viewpoint of more efficiently exposing the top-layer metals wiring TML in the pad formation region PAR, let us consider the case where the passivation film PAS for the exposure and the flattening film FF immediately below are removed by etching and, in order to form a level difference LVL in the dicing region, the passivation film PAS and the silicon oxide film as a flattening film FF in contact with the undersurface thereof are removed by etching. In this regard, when the removal is done such that the flattening film FF immediately below the removed passivation film PAS reaches the region (lower side) on the semiconductor substrate SUB side rather than the upper surface of the top-layer metal wiring TML which configures the guard ring GR, the amount GP of the finally formed level difference LVL (see FIG. 3) greatly increases. Moreover, as in the above embodiment, for example, when not only the dicing line region DLD of the edge region EGR but also the passivation film PAS etc. of the guard ring region GRR are removed to form the level difference LVL, if the flattening film FF is removed from the area lower than the upper surface of the top-layer metal wiring TML, the upper surface of the top-layer metal wiring TML of the guard ring GR is exposed.

Thus, when the amount GP of the level difference LVL grows to such an extent that the flattening film FF over the top-layer metal wiring TML of the guard ring GR disappears, the flatness of the uppermost surface of the edge region EGR becomes worse considerably. As a result, in the later step (see FIG. 8), the flatness of the upper surface of the flattening film FF formed in the photodiode region PDR can also become worse. This is because, in the step in FIG. 8, in order to flatten the upper surface of the flattening film FF, the flattening film is required to be formed such that once the inside of the level difference LVL is filled and, at the same time, the exposed upper surface of the top-layer metal wiring TML of the guard ring GR is covered.

Therefore, when the level difference of the edge region EGR becomes large, in order to flatten the upper surface of the photodiode region PDR, in the photodiode region PDR, it is required that the flattening film FF in FIG. 8 being in contact with the undersurface of the color filter CF is formed particularly thick. This is because, if there is formed a photodiode region PDR having low flatness, unevenness in the image formed by the image sensor increases, and controllability of the picture elements can be degraded.

However, if the flattening film FF in FIG. 8 is formed thick, its cost may increase. Moreover, when the flattening film FF is thickly formed, incidence efficiency of light from the above of the color filter CF to the photodiode PD decreases, and performance of the photodiode PD may decrease.

Therefore, according to one embodiment, in order to suppress occurrence of cracks in the semiconductor chip CHP and to prevent the controllability of picture element from being lowered, the level difference LVL is formed with respect to the upper surface of the passivation film PAS in the chip section IMC of the uppermost surface (upper surface of the flattening film FF) of the edge region EGR. In such a case, it is taken into account that the volume of the level difference LVL is relatively small. Specifically, the level difference LVL should be formed such that the above level difference LVL removes the passivation film PAS in the edge region EGR (dicing line region DLR, in particular) and that the flattening film FF remains over the upper surface of the top-layer metal wiring TML of the guard ring GR in the edge region EGR. In this regard, when the passivation film PAS is etched, even if the flattening film FF in contact with the undersurface thereof is over-etched, as shown in FIG. 5, it is over-etched to such an extent that it does not reach the upper surface of the guard ring GR, and it is adjusted that the flattening film FF remains over the upper surface of the top-layer metal wiring TML of the guard ring GR.

The above arrangement brings about the effect of suppressing the cracks being originated at the passivation film PAS in the dicing line region DLR and advancing toward the semiconductor chip CHP, and suppressing deterioration in flatness of the uppermost surface of the edge region EGR. As a result, the flatness of the photodiode region PDR can be maintained.

The flatness over the metal wiring TML is secured by forming the level difference LVL where the flattening film FF covers the upper surface of the top-layer metal wiring TML of the guard ring GR, that is, by the flattening film FF remaining over the upper surface of the top-layer metal wiring TML of the guard ring GR. As a result, without increasing the production cost and degrading the reliability of light-receiving efficiency etc. of the photodiode PD, flatness of the photodiode region PDR can be maintained.

As described above, according to one embodiment, the action and effect of both suppressing the crack problem and securing flatness can be achieved. Furthermore, by forming the passivation film PAS as a protecting film over the flattening film FF (over the guard ring GR), the effect of keeping moisture etc. from entering the photodiode PD etc. can be increased. As a result, according to one embodiment, a highly reliable semiconductor chip CHP can be provided.

Second Embodiment

Figure 9:
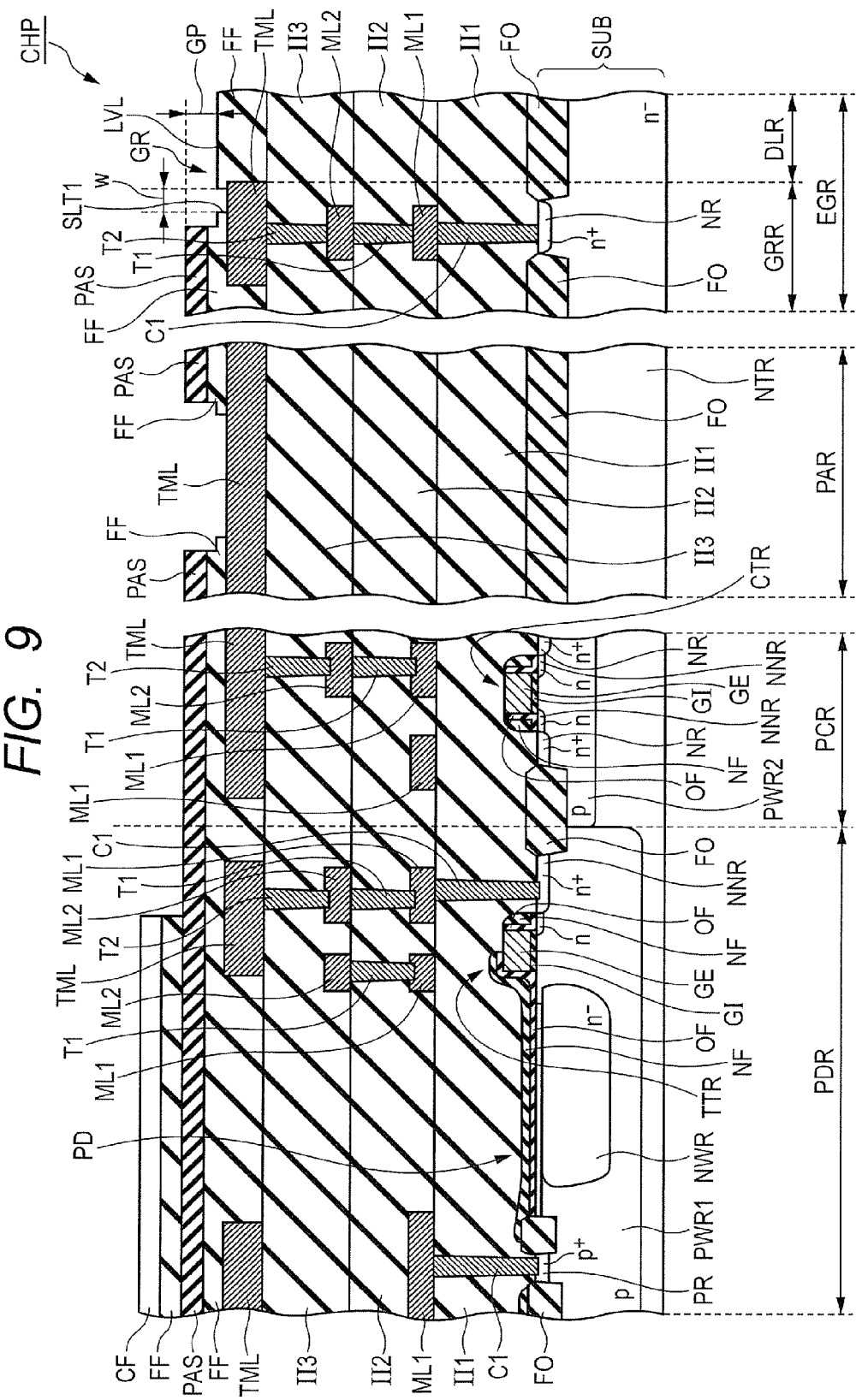
FIG. 9 is a schematic cross-sectional view, equivalent to that in FIG. 3, of a semiconductor chip according to a second embodiment.

Referring to FIG. 9, description will be given to the configuration of each part of the semiconductor chip CHP of the present embodiment.

Referring to FIG. 9, the semiconductor chip CHP of the present embodiment has basically the same configuration as the semiconductor chip CHP of the first embodiment (FIG. 3). However, the semiconductor chip CHP of the present embodiment is different from that of the first embodiment in that first slots SLT1 are formed in the edge region EGR.

The first slot SLT1 is formed in the level difference LVL which is a removed part of the passivation film PAS. More specifically, the first slot SLT1 is formed in part of the region of the upper surface of the flattening film FF being a bottom face of the level difference LVL as a region (removed part) where the flattening film FF is removed. The first slots SLT1 are formed immediately above the top-layer metal wiring TML of the guard ring GR. Further, the first slots SLT1 extend vertically (in a depth direction) in FIG. 9 starting from a part of the upper surface of the flattening film FF immediately above the top-layer metal wiring TML and reaching the upper surface of the top-layer metals wiring TML.

As compared to the level difference LVL, the width in a horizontal direction in FIG. 9 of the first slot SLT1 is extremely narrow. Specifically, it is preferred that the width w of the first slot SLT1 be 2 μm or greater and 10% or smaller of the width (blade width) of an edged tool used for dicing. Since the blade width is 30 μm or greater but not greater than 60 μm as described above, the width w of the first slot SLT1 is usually 3 to 6 μm or smaller.

By allowing the width w to be 2 μm or greater, the first slot SLT1 is reliably opened, and the effect of suppressing chipping is enhanced. Further, as described later, the effect of the slot SLT1 suppressing the progress of the cracks can be more enhanced. Moreover, the upper limit of the width w being 10% or smaller of the blade width is determined from a viewpoint of suppressing, as much as possible, the first slot SLT1 being filled with the color filter CF when the color filter CF is formed.

Since the flattening film FF is removed in a region where the first slot SLT1 is formed, the upper surface of the top-layer metal wiring TML of the guard ring GR is exposed. However, the width w of the first slot SLT1 has, usually, a so-called slit-like cross section, being sufficiently narrow as compared to the width of the guard ring GR. For this reason, if substantially all of the upper surface of the top-layer metal wiring TML is covered with the flattening film FF in the regions except the first slot SLT1, it is to be assumed that, with regard to the embodiment in FIG. 9 also, the upper surface of the top-layer metal wiring TML is covered with the flattening film FF (the flattening film FF remains).

Although the configuration of the semiconductor chip CHP of the present embodiment is different from the configuration of the semiconductor chip CHP of the first embodiment (FIG. 3) in the above aspects, it is similar to the configuration of the semiconductor chip CHP of the first embodiment (FIG. 3) in other aspects. For this reason, the same constituent elements as in FIG. 3 will be identified by the same symbols or reference numerals and overlapping descriptions will be omitted. This holds true of embodiments to be described below.

Now, referring to FIGS. 10 to 12, description will be given to a manufacturing method of the semiconductor device of the present embodiment. Also, in this regard, only the points which are different from those of the manufacturing method of the first embodiment will be described.

Figure 10:
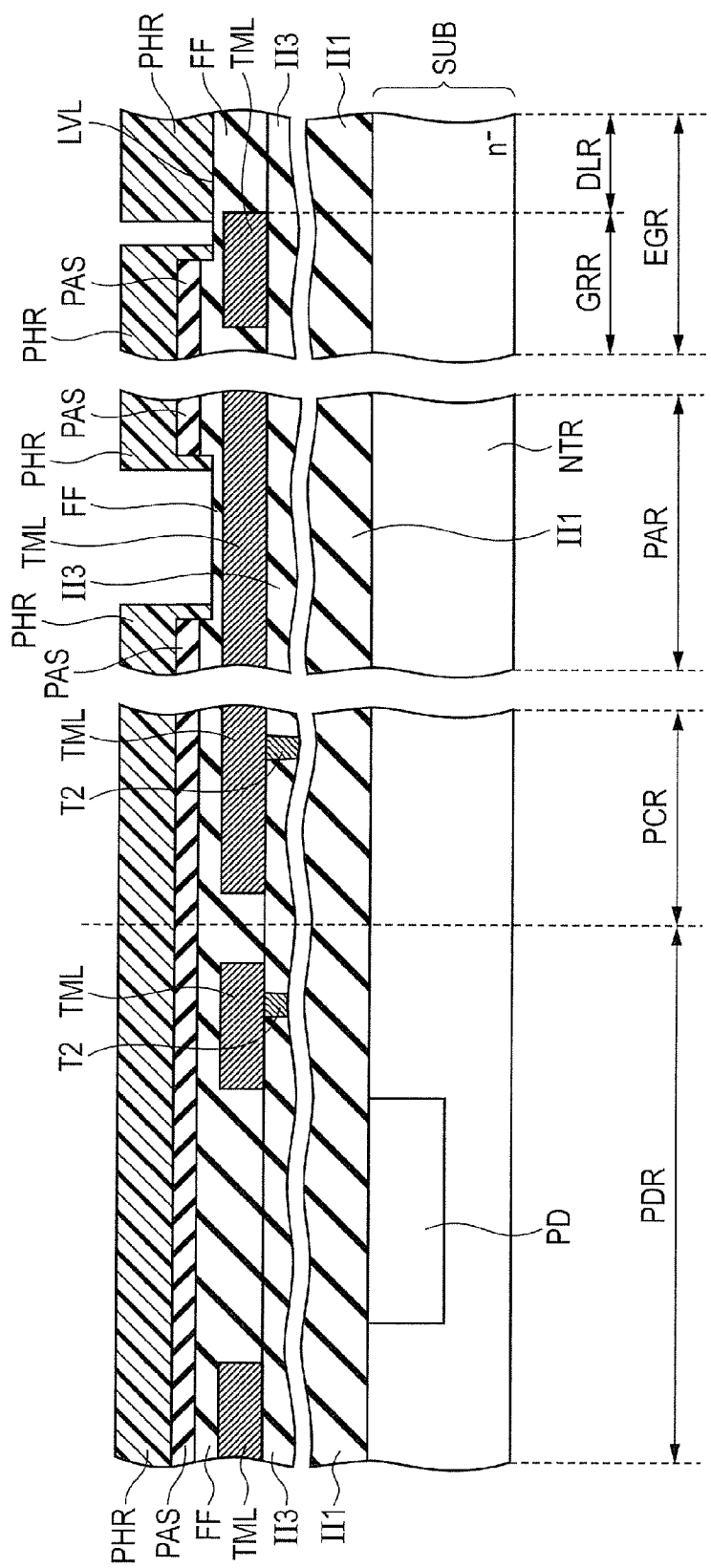
FIG. 10 is a schematic cross-sectional view illustrating a first step of a manufacturing method of a semiconductor device according to the second embodiment.

Referring to FIG. 10, after the process as in the steps up to the one in FIG. 5 of the first embodiment, for example, by ordinary photoengraving process using a positive type photoresist PHR, there are formed patterns of the photoresist PHR having openings in a central part, in a plan view, of the pad in the pad formation region PAR and in a region of the edge region EGR where the first slot SLT1 is to be formed. In this regard, the pattern of the photoresist PHR is so formed as to cover substantially all over the region except the above opening.

Figure 11:
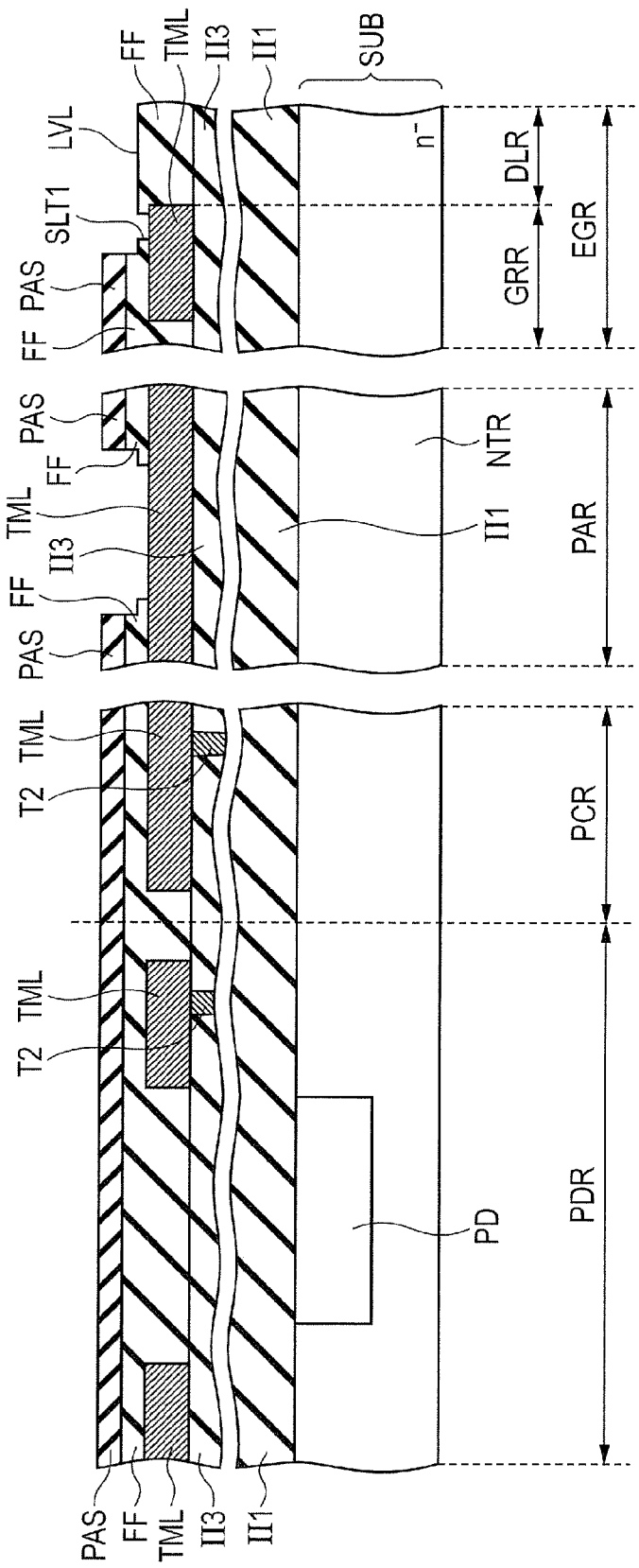
FIG. 11 is a schematic cross-sectional view illustrating a second step of a manufacturing method of a semiconductor device according to the second embodiment.

Referring to FIG. 11, by ordinary etching process using the pattern of the photoresist PHR, the flattening film FF in contact with an undersurface of the passivation film PAS is patterned. Then, the flattening films FF in the central part, in a plan view, of the pad formation region PAR and in part of the region immediately above the guard ring GR are removed. In this regard, the first slot SLT1 is formed by removing the flattening film FF immediately above the guard ring GR such that it reaches the depth of the upper surface of the guard ring GR from the upper surface thereof. However, as in the first embodiment, the flattening film FF remains in regions over the guard ring GR except for the region in which the first slot SLT1 is formed.

Figure 12:
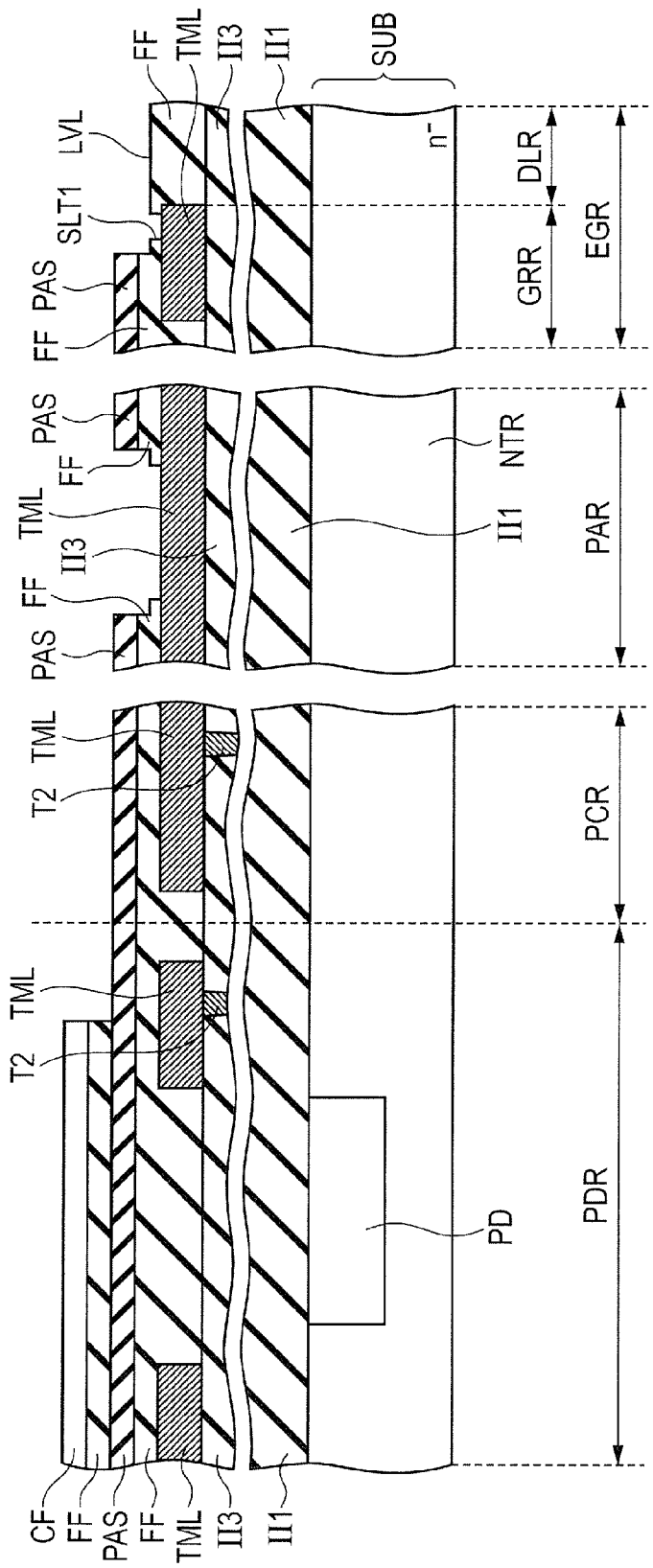
FIG. 12 is a schematic cross-sectional view illustrating a third step of a manufacturing method of a semiconductor device according to the second embodiment.

Referring to FIG. 12, post processing as in FIG. 8 is performed hereafter. Next, the operation and effect of the present embodiment will be explained. In addition to the operation and effect of the first embodiment, the present embodiment has the following operation and effect.

According to the present embodiment, even if the cracks generated from the dicing line region DLR during dicing advance toward the photodiode region PDR, with use of the above first slots SLT1, the progress can be stopped immediately above the guard ring GR. This is because the flattening film FF is broken off at the slot SLT1 and the progress of the cracks propagating inside the flattening film FF is stopped. For this reason, as compared to the first embodiment, it becomes possible to further reduce the possibility, in the semiconductor chip CHP, of the cracks reaching the photodiode region PDR.

The slot SLT1 at least extends in the depth direction from the upper surface of the flattening film FF to the upper surface of the guard ring GR. Therefore, the cracks propagating inside the flattening film FF from the dicing line region DLR toward the photodiode region PDR (in a direction along a main surface of the semiconductor substrate SUB) always proceed via the slot SLT1 immediately above the guard ring GR. For this reason, the cracks advancing toward the photodiode region PDR immediately above the guard ring GR are inevitably interrupted by the slot SLT1.

According to the present embodiment, because of the presence of the slot SLT1, part of the upper surface of the top-layer metal wiring TML of the guard ring GR is not covered with the flattening film FF. However, as described above, as compared to the width of the guard ring GR, the width w (see FIG. 9) of the slot SLT1 is sufficiently narrow. Further, the area of the slot SLT1 is sufficiently small as compared to the area of the guard ring GR. For this reason, if the upper surface of the guard ring GR in regions except the slot SLT1 is covered with the flattening film FF, the flatness of the flattening film FF can be secured over the upper surface of the guard ring GR even when the slot SLT1 is formed.

As shown in FIG. 9, it is preferred that particularly the first slot SLT1 be formed only immediately above the central part except for the end portion and, of the region immediately above the guard ring GR, not formed immediately above the end portion in the width direction (horizontal direction in FIG. 9) intersecting with the direction in which the guard ring GR extends two dimensionally in the shape of a rectangle. In this way, at least at both one and the other end portions of the above width direction, by the upper surface of the top-layer metal wiring TML being covered with the flattening film FF, the effect of maintaining the flatness of the upper surface of the flattening film FF is enhanced.

Third Embodiment

First, referring to FIG. 13, description will be given to the configuration of each part of the semiconductor chip CHP of the present embodiment.

Figure 13:
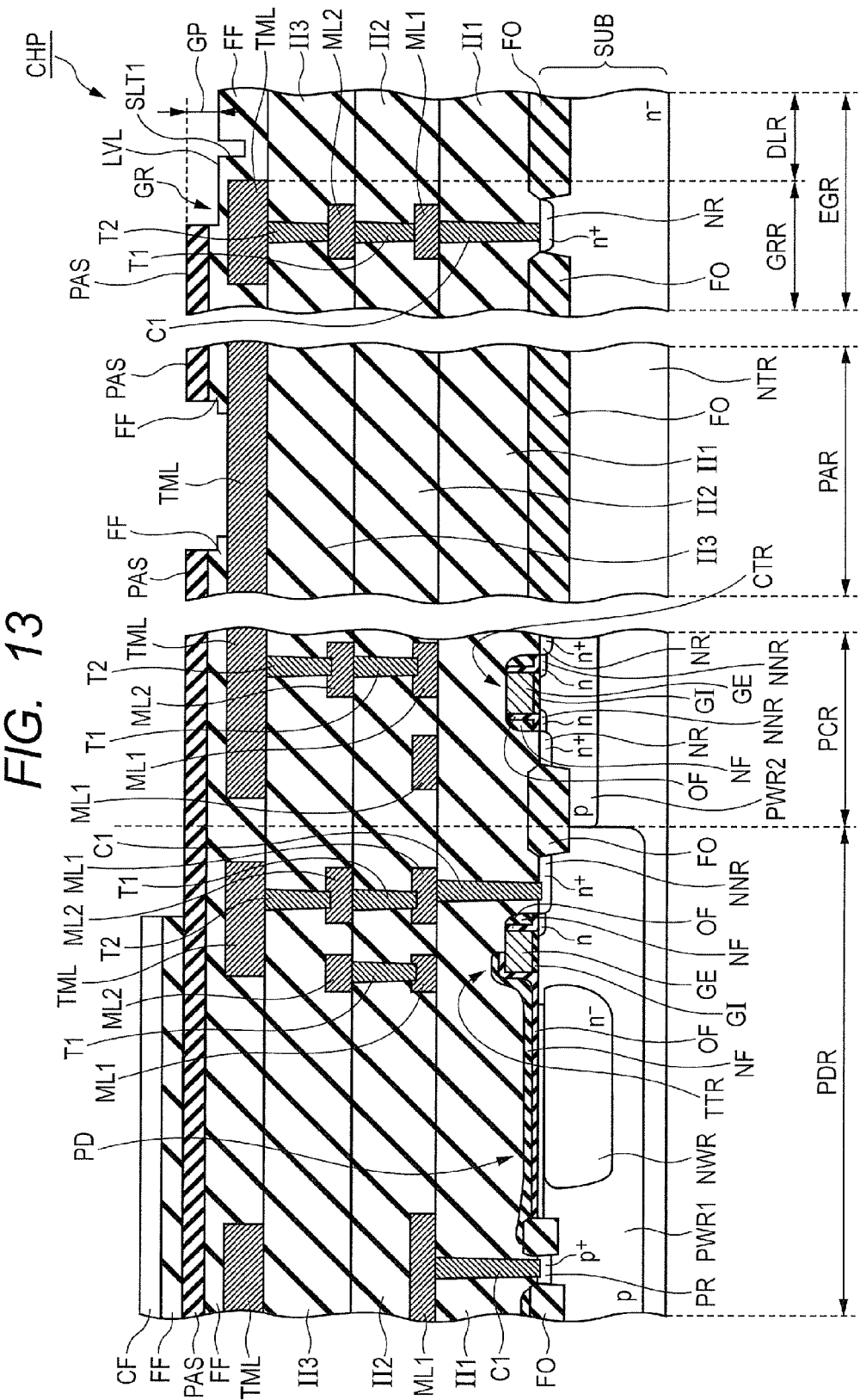
FIG. 13 is a schematic cross-sectional view, equivalent to that in FIG. 3, of a semiconductor chip according to a third embodiment.

Referring to FIG. 13, the semiconductor chip CHP of the present embodiment has basically the same configuration as those of the semiconductor chips CHP of the first and second embodiments (FIGS. 3 and 9). However, in the case of the semiconductor chip CHP according to the present embodiment, the first slot SLT1 in the level difference LVL of the edge region EGR is formed, in a plan view, outside (the other side of the top-layer metal wiring TML opposed to the photodiode region PDR: right-hand side in FIG. 13) the top-layer metal wiring TML of the guard ring GR. Specifically, the first slot SLT1 is formed, for example, in the dicing line region DLR.

The first slot SLT1 in FIG. 13 is formed, outside the guard ring GR, in part of the regions of the upper surface of the flattening film FF which is a bottom surface of the level difference LVL. Further, starting from the part of the upper surface of the flattening film FF, the first slot SLT1 extends in a vertical direction (depth direction) in FIG. 13 so as to reach the depth of the upper surface of the top-layer metal wiring TML. In addition, as shown in FIG. 13, it is preferred that the slot SLT1 be so formed as to reach a region deeper than the upper surface of the top-layer metal wiring TML.

Figure 14:
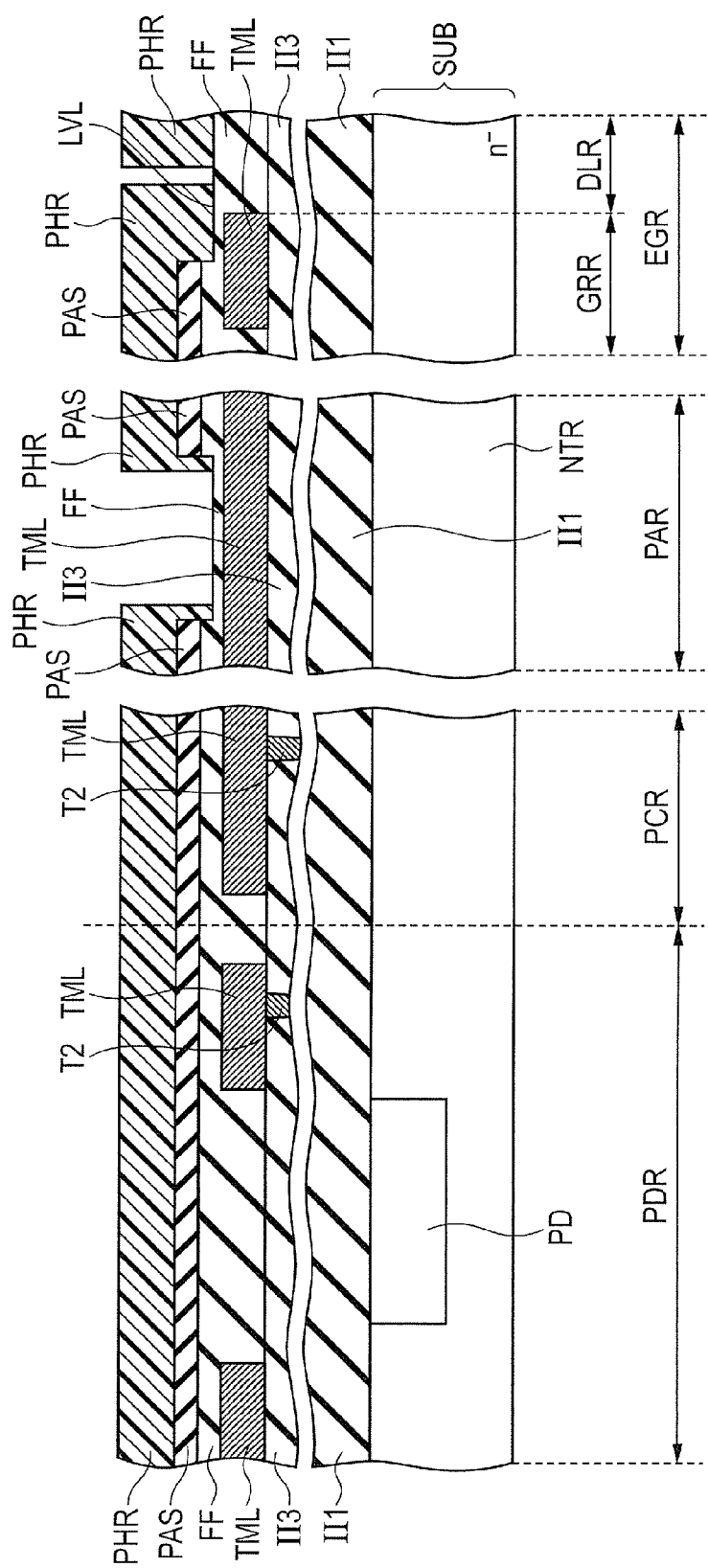
FIG. 14 is a schematic cross-sectional view illustrating a first step of a manufacturing method of a semiconductor device according to the third embodiment.
Figure 15:
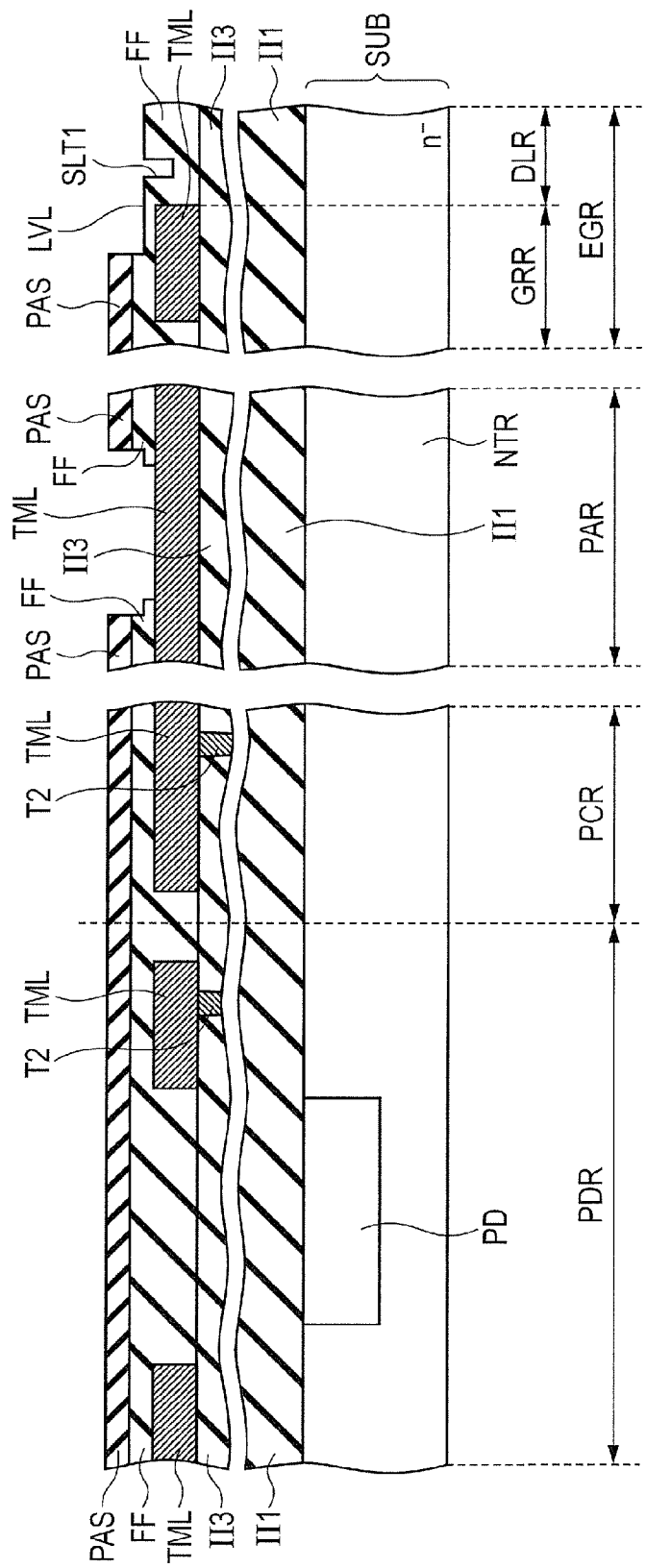
FIG. 15 is a schematic cross-sectional view illustrating a second step of a manufacturing method of a semiconductor device according to the third embodiment.

Referring to FIGS. 14 to 15, the manufacturing method of the present embodiment is different from that of the second embodiment shown in FIGS. 10 to 11 only in that the first slot SLT1 is formed outside the guard ring GR. In other aspects, the manufacturing method of the present embodiment is similar to that of the second embodiment.

Next, the operation and effect of the present embodiment will be described. In addition to the operation and effect of the second embodiment, the present embodiment has the following operation and effect.

According to the present embodiment, the immediately above area of the top-layer metal wiring TML of the guard ring GR is not exposed because of the first slot SLT1. That is, (as in the first embodiment, for example), substantially all the surface of the top-layer metals wiring TML is covered with the flattening film FF. For this reason, it is possible to suppress the generation of foreign matter resulting from the metal material of the top-layer metal wiring TML.

Specifically, for example, during the etching of the flattening film FF, when the top-layer metal wiring TML immediately below is etched due to over-etching, it is possible that foreign matter is generated by the reaction of oxygen atoms in the removed flattening film FF (silicon oxide film) and the metal material of the metal wiring TML. However, it becomes possible to suppress the degradation of reliability due to the above reactive foreign matter by the flattening film FF immediately above the top-layer metal wiring TML not being subjected to etching.

Fourth Embodiment

First, referring to FIG. 16, description will be given to the configuration of each part of the semiconductor chip CHP of the present embodiment.

Figure 16:
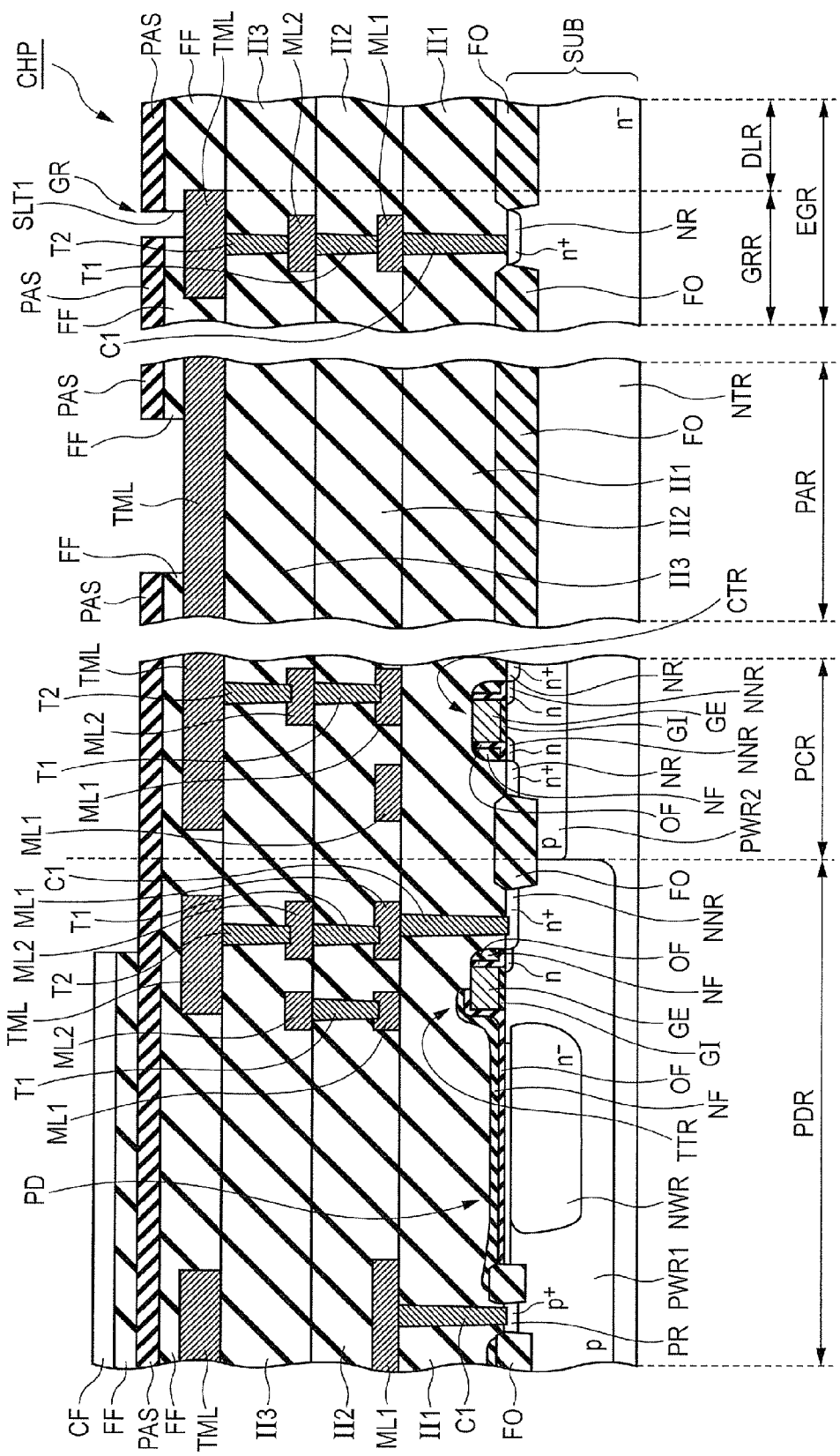
FIG. 16 is a schematic cross-sectional view, equivalent to that in FIG. 3, of a semiconductor chip according to a fourth embodiment.

Referring to FIG. 16, the semiconductor chip CHP of the present embodiment has basically the same configuration as that of the semiconductor chip CHP in each embodiment described above. In the present embodiment also, as in the second embodiment, the first slot SLT1 is formed immediately above the guard ring GR.

However, in the semiconductor chip CHP according to the present embodiment, the passivation film PAS is not removed in the edge region EGR, and the level difference LVL is not formed. In part of the region immediately above the guard ring GR, the first slot SLT1 is so formed as to extend from the upper surface of the passivation film PAS, through the passivation film PAS and the flattening film FF in contact with an undersurface thereof, and reach the upper surface of the top-layer metal wiring TML of the guard ring GR. The passivation film PAS in the edge region EGR is removed in the region where the first slot SLT1 is formed. However, the passivation film PAS is not removed in other regions and extends in the cross-sectional view of FIG. 16, to the end portion (outer edge portion of the semiconductor chip CHP after dicing) of the edge region EGR. In other words, it is preferred that, in the edge region EGR, the passivation film PAS be formed all over the surface except the region where the first slot SLT1 is formed.

Next, referring to FIGS. 17 to 18, description will be given to a manufacturing method of the semiconductor device of the present embodiment. Also, the only points being different from each of the embodiments described above will be explained.

Figure 17:
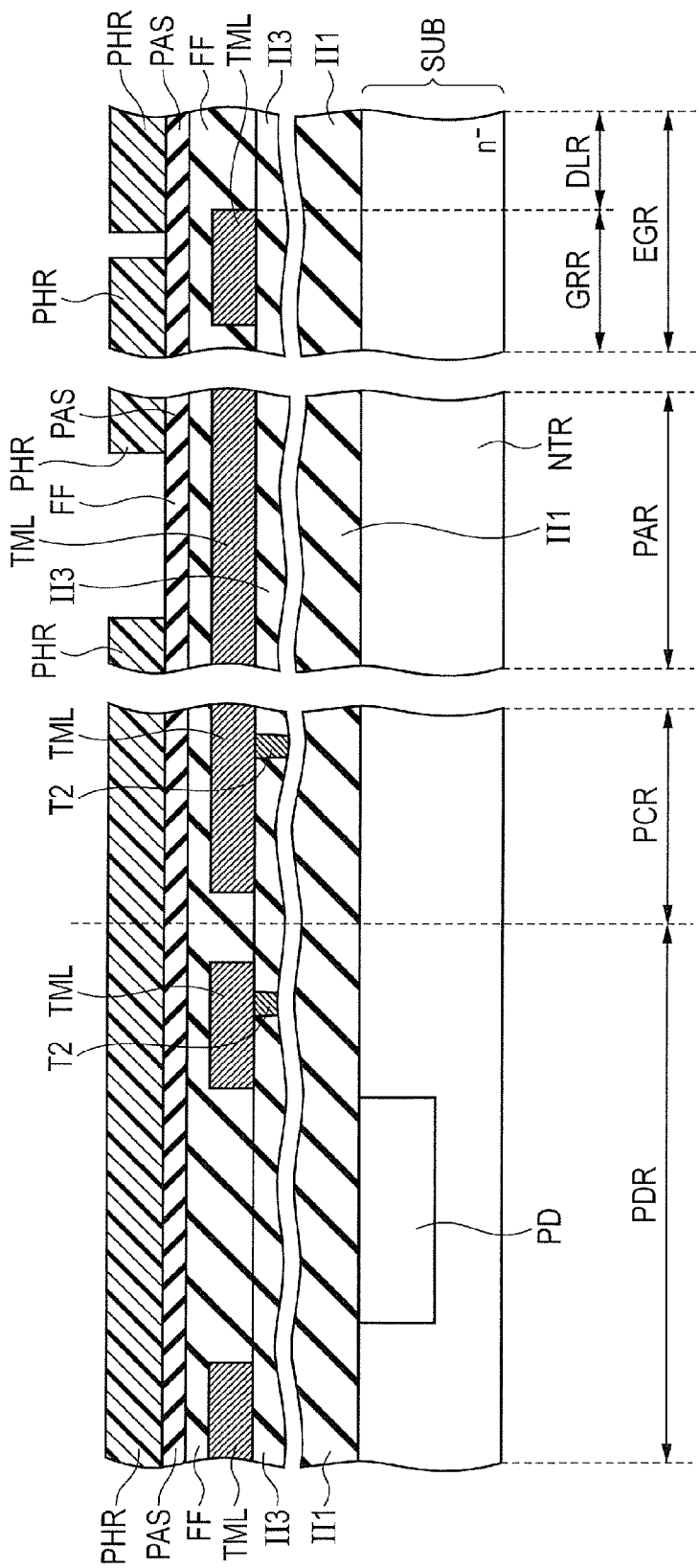
FIG. 17 is a schematic cross-sectional view illustrating a first step of a manufacturing method of a semiconductor device according to a fourth embodiment.

Referring to FIG. 17, as in the step in FIG. 4 of the first embodiment, in each region including the edge region EGR of the semiconductor substrate SUB (semiconductor wafer SW), there are formed the top-layer metal wiring TML, the flattening film FF which covers the upper surface thereof, and the passivation film PAS thereon.

Next, for example, by ordinary photoengraving process using a positive type photoresist PHR, there is formed a pattern of the photoresist PHR which has an opening in a region where the passivation film PAS is to be removed. In this regard, there is formed the pattern of the photoresist PHR which has openings in part (central part, in a plan view) of the pad formation region PAR and part of the edge region EGR. However, in the edge region EGR, the opening is formed only in the region where the first slot SLT1 is to be formed.

Figure 18:
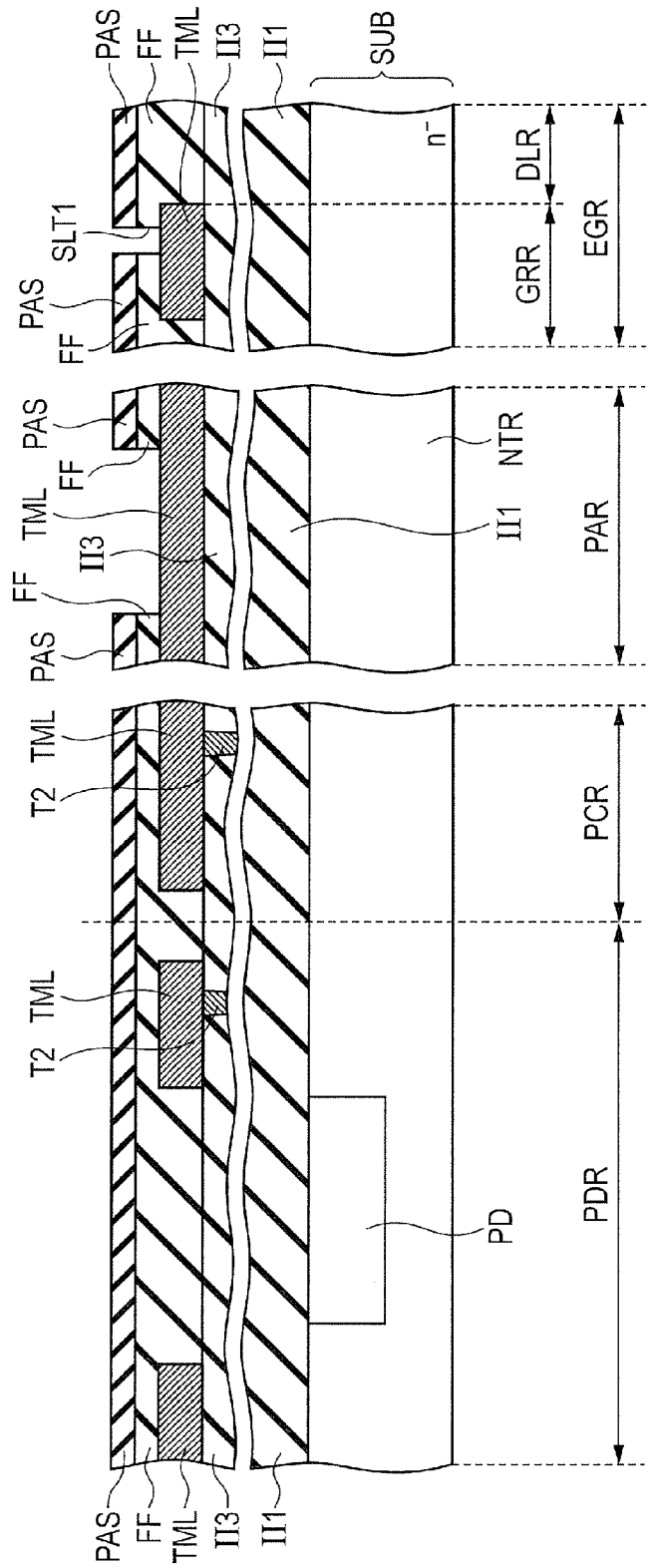
FIG. 18 is a schematic cross-sectional view illustrating a second step of a manufacturing method of a semiconductor device according to the fourth embodiment.

Referring to FIG. 18, the passivation film PAS is patterned according to ordinary etching process using the pattern of the above photoresist PHR. Then, according to the opening of the photoresist PHR, the passivation film PAS in part (central part, in a plan view) of the pad formation region PAR and part (region in which the first slot SLT1 is formed) of the edge region EGR are removed. Next, by performing the ordinary etching process again using the pattern of the passivation film PAS as a mask, the flattening film FF immediately below the passivation film PAS is etched.

By removing the flattening film FF immediately below the region where the passivation film PAS is etched, in the pad formation region PAR, part (central part, in a plan view) of the top-layer metal wiring TML is exposed. In this regard, both the passivation film PAS and the flattening film FF are subjected to etching such that respective openings match with each other.

In the edge region EGR, immediately above the top-layer metal wiring TML of the guard ring GR, the flattening film FF is subjected to etching such that it passes through the passivation film PAS from the upper surface of the passivation film PAS and reaches the upper surface of the top-layer metal wiring TML of the guard ring GR, and the first slot SLT1 is formed. However, in the edge region EGR including the immediately above portion of the guard ring GR, both the passivation film PAS and the flattening film FF remain without being removed in the regions except for the first slot SLT1. That is, what is formed as a removed part of the passivation film PAS is the first slot SLT1 alone. Therefore, the passivation film PAS extends to an end portion of the main surface of the formed semiconductor chip CHP.

Next, the operation and effect of the present embodiment will be described. According to the present embodiment, in the edge region EGR, as a removed part of the passivation film PAS, the first slot SLT1 alone is formed, and a wide level difference LVL is not formed. Moreover, as described with regard to the second embodiment, the width of the first slot SLT1 is sufficiently narrow. Therefore, even if the level difference is formed by the slot SLT1, it does not affect the flatness of the whole edge region EGR. That is, there is no substantial level difference in the edge region EGR. Since the level difference LVL is not formed, the flatness of the semiconductor chip CHP is more enhanced than each embodiment described above.

Moreover, because of the presence of the first slot SLT1, as in the second and third embodiments, it is possible to suppress the progress (propagation) of the cracks resulting from the dicing applied to the photodiode region PDR. Therefore, also in the present embodiment, it is possible to achieve the operation and effect of both suppressing the crack problem etc. and securing flatness. Furthermore, as in each of the above embodiments, the role of the passivation film PAS over the flattening film FF to prevent moisture from entering the photodiode region PDR etc. can be secured.

Fifth Embodiment

First, referring to FIG. 19, description will be given to the configuration of each part of the semiconductor chip CHP of the present embodiment.

Figure 19:
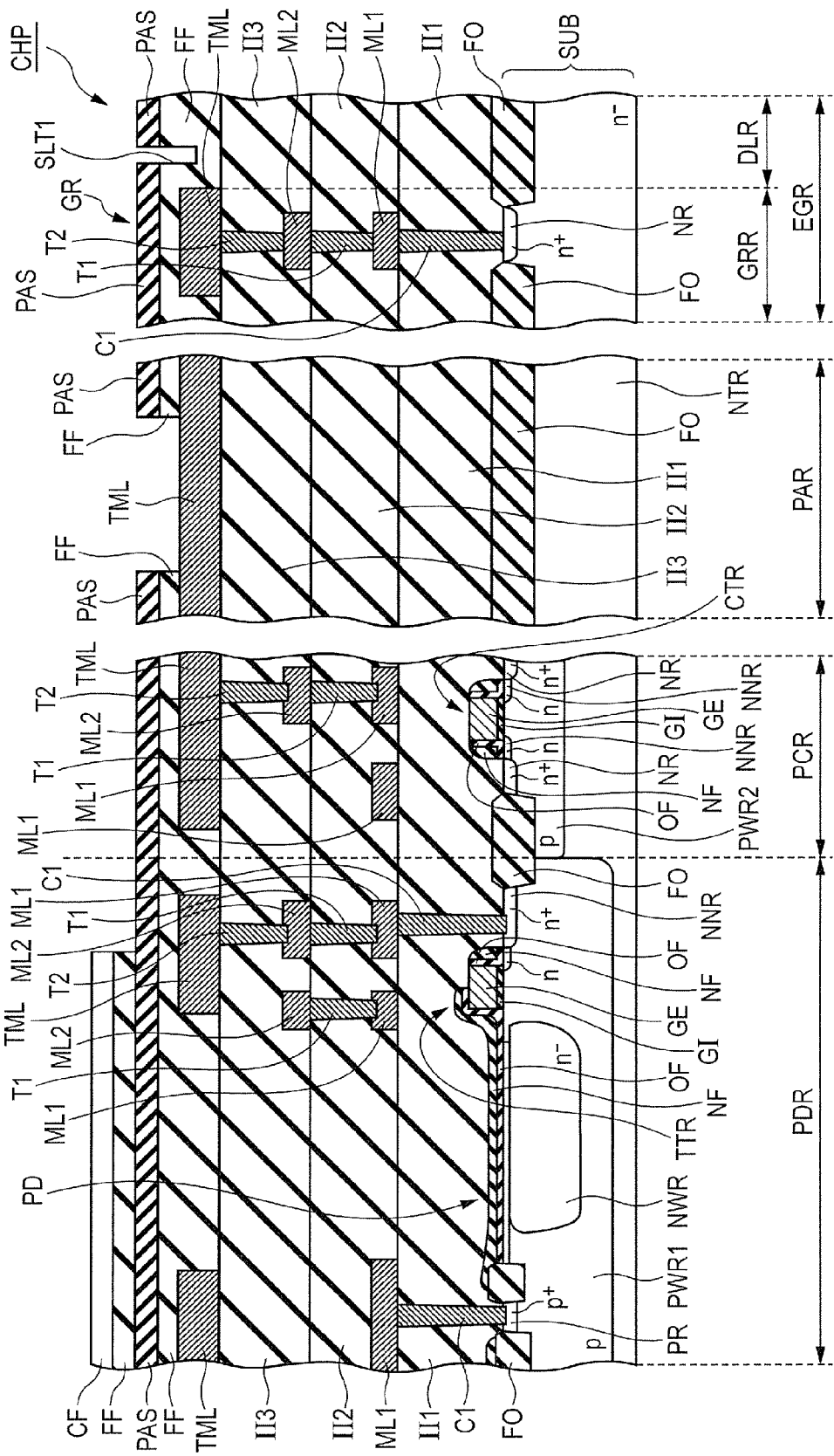
FIG. 19 is a schematic cross-sectional view, equivalent to that in FIG. 3, of a semiconductor chip according to a fifth embodiment.

Referring to FIG. 19, the semiconductor chip CHP of the present embodiment has basically the same configuration as the semiconductor chip CHP of the fourth embodiment. According to the fourth embodiment, in a plan view, at the same position as in the second embodiment, the first slot SLT1 as in the second embodiment is formed. According to the present embodiment, however, in a plan view, at the same position as in the third embodiment, the first slot SLT1 as in the third embodiment is formed. Specifically, in a plan view, the first slot SLT1 in the edge region EGR is formed outside (the other side of the top-layer metal wiring TML opposed to the photodiode region PDR: right-hand side in FIG. 13) the top-layer metal wiring TML of the guard ring GR.

Figure 20:
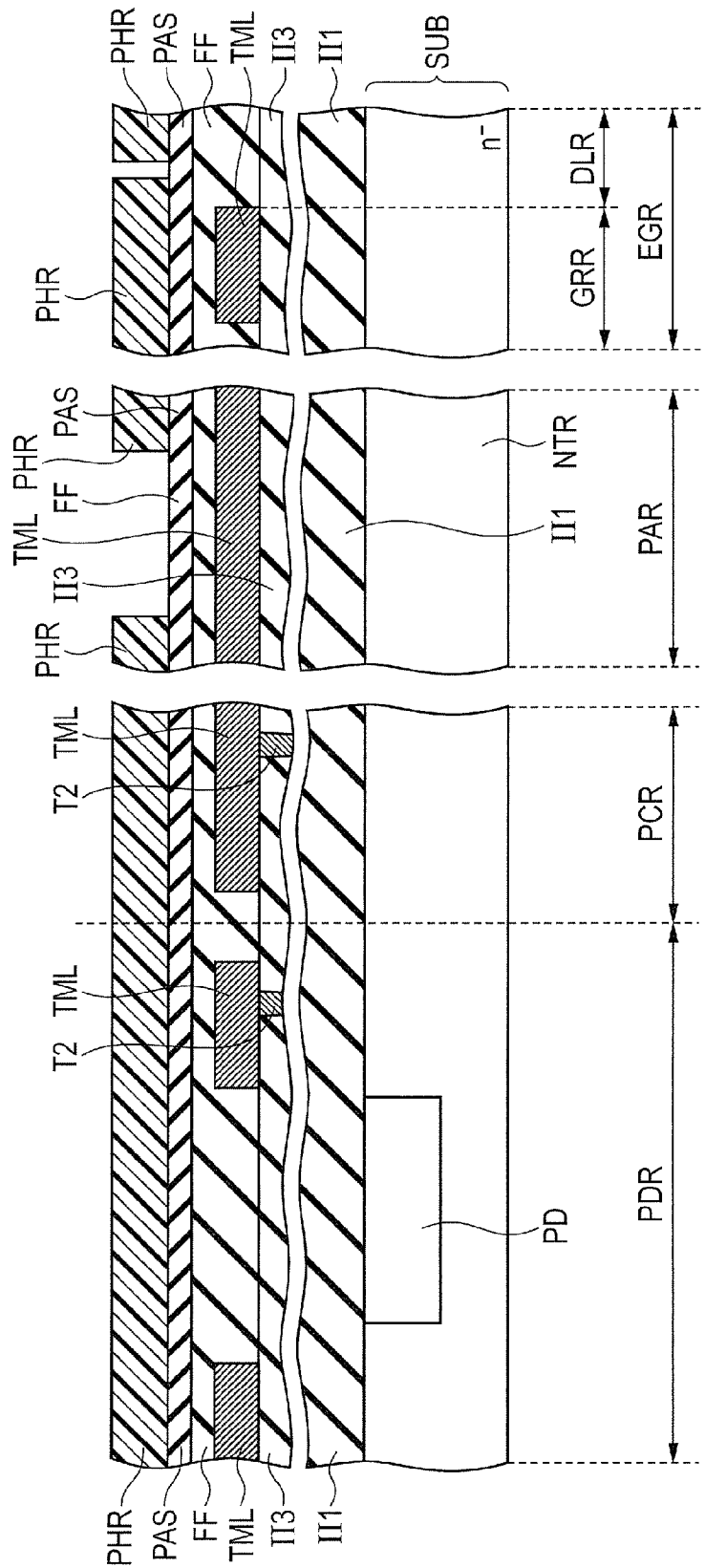
FIG. 20 is a schematic cross-sectional view illustrating a first step of a manufacturing method of a semiconductor device according to the fifth embodiment.
Figure 21:
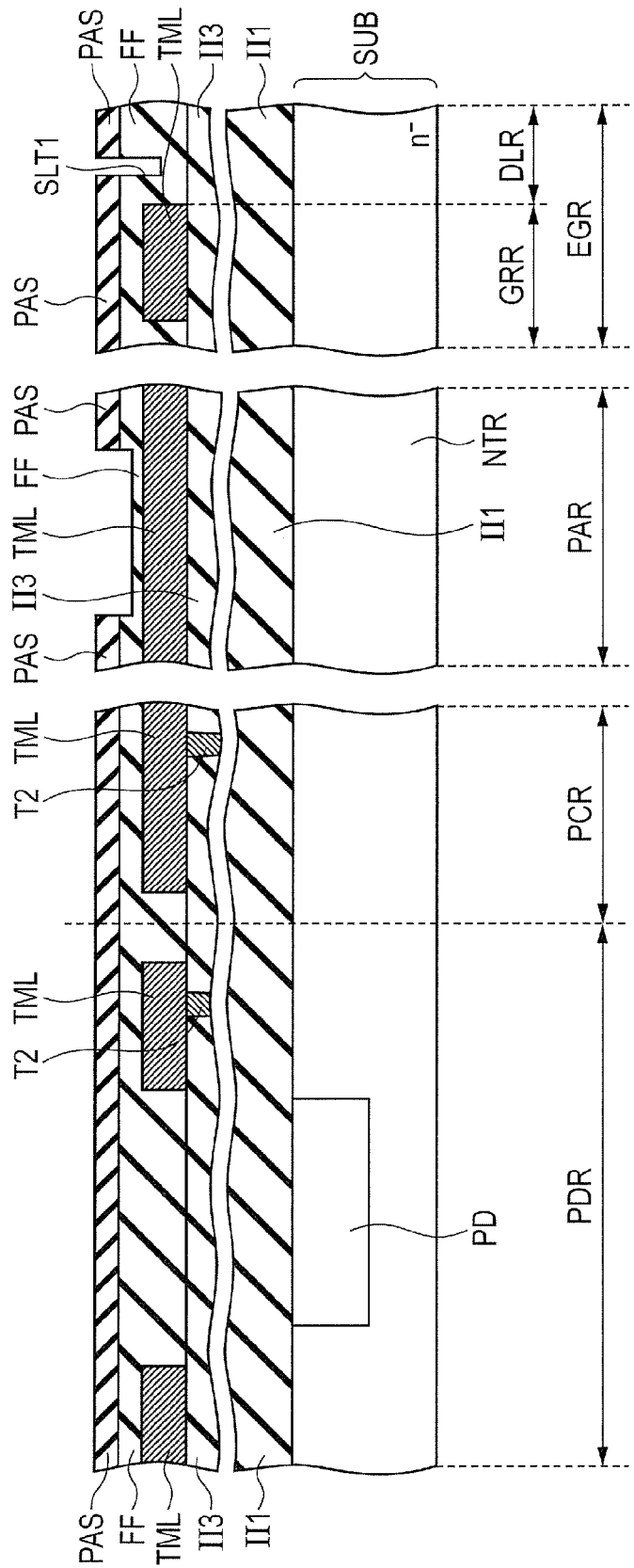
FIG. 21 is a schematic cross-sectional view illustrating a second step of a manufacturing method of a semiconductor device according to the fifth embodiment.

Referring to FIGS. 20 to 21, a manufacturing method of the present embodiment is different from that of the second embodiment shown in FIGS. 10 to 11 only in that the first slot SLT1 is formed outside the guard ring GR. In other aspects, the manufacturing method of the present embodiment is similar to that of the second embodiment.

In addition to the operation and effect of the fourth embodiment, the present embodiment has the operation and effect similar to that of the third embodiment. Specifically, since the immediately above area of the top-layer metal wiring TML1 of the guard ring GR is not exposed, occurrence of foreign matter resulting from metal material can be suppressed.

Sixth Embodiment

Figure 22:
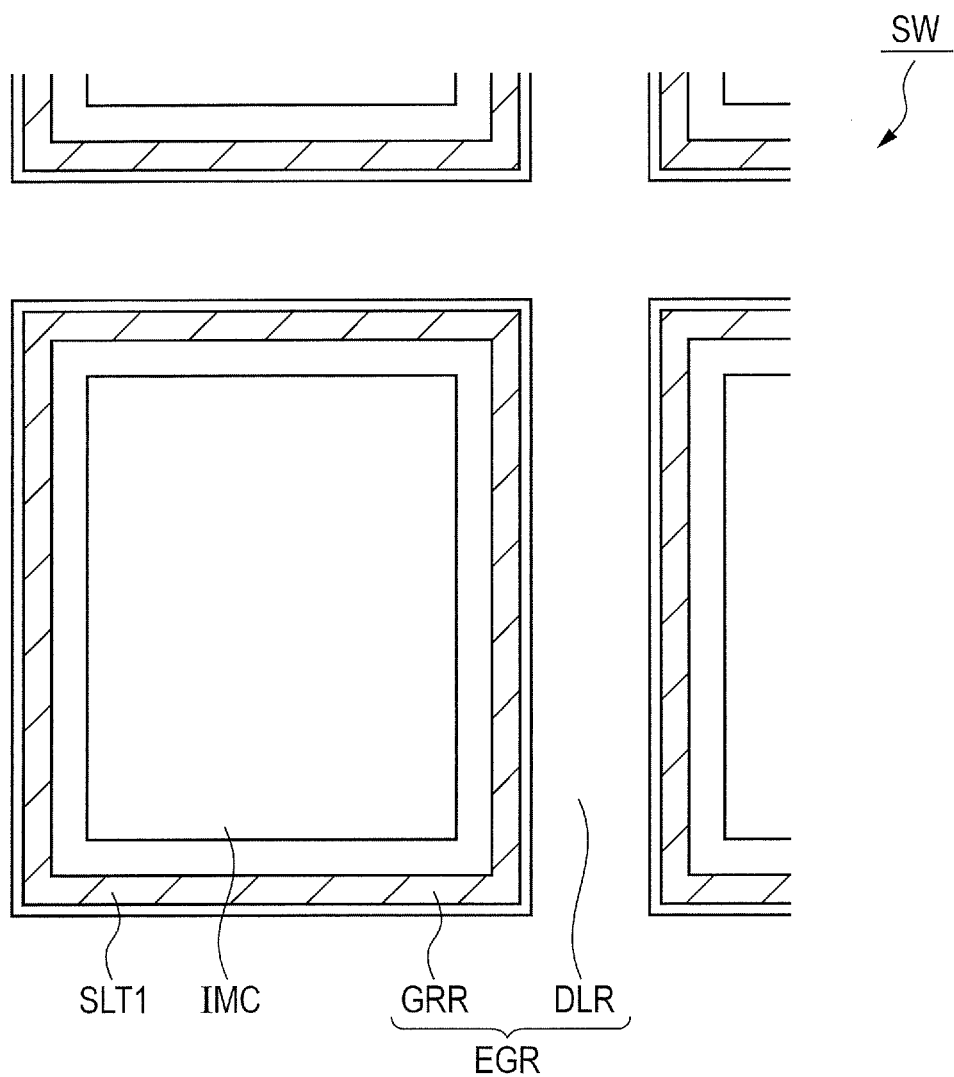
FIG. 22 is a schematic plan view illustrating part of a semiconductor wafer for forming the semiconductor chip according to the fourth embodiment.

For example, according to the semiconductor chip CHP of the fourth embodiment, the first slot SLT1 is formed immediately above the top-layer metal wiring TML of the guard ring GR. Specifically, referring to FIG. 22, a rectangular slot SLT1 similar to that of the guard ring region GRR is formed in the rectangular guard ring region GRR, in a plan view, surrounding the circumference of the chip region IMC of the semiconductor wafer SW before being cut into respective semiconductor chips CHP. Thus, in a plan view, the first slot extends along the edge portion (edge portion of the circumference, in particular) of the chip region IMC, and has the same rectangular planar shape as that of the circumference of the chip region IMC.

Figure 23:
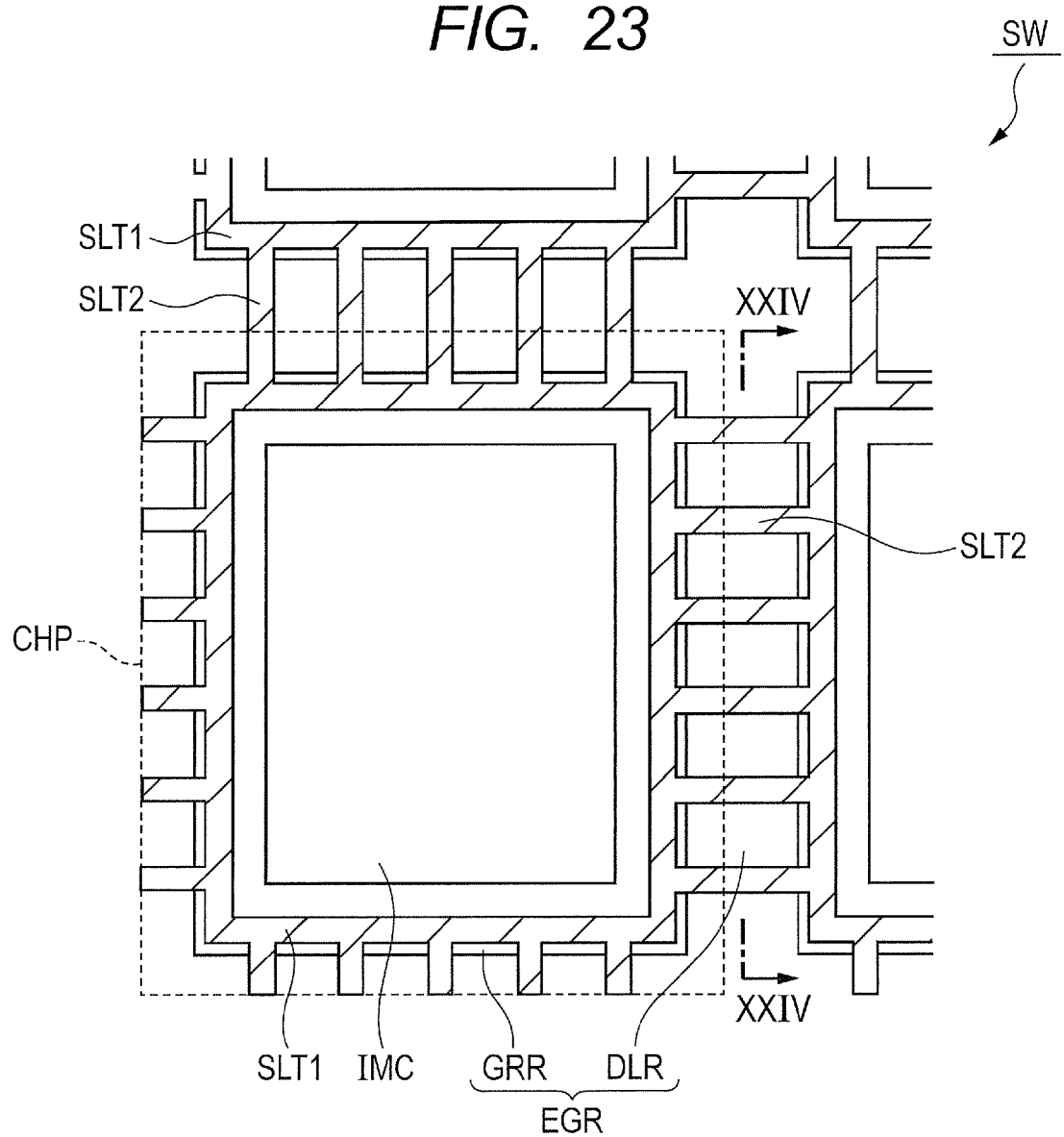
FIG. 23 is a schematic plan view illustrating part of a semiconductor wafer for forming the semiconductor chip according to a sixth embodiment.

Referring to FIG. 23, as compared to the fourth embodiment, a second slot SLT2 in addition to the first slot SLT1 if formed in the present embodiment. In the semiconductor wafer SW before being cut into semiconductor chips CHP, in a plan view, the second slot SLT2 extends in a direction intersecting with (perpendicular to, for example) the direction in which the first slot SLT1 extends.

The second slot SLT2 is formed outside the first slot SLT1 in each semiconductor chip CHP (on the other side of the first slot SLT1 opposed to the photodiode region PDR). As a result, the second slots SLT2 are formed such that the first slots SLT1 formed in a pair of guard ring regions GRR adjacent to each other in the semiconductor wafer SW, in particular, are coupled with each other. The dicing line region DLR is formed outside the guard ring region GRR so as to surround it. That is, the second slot SLT2 is formed so as to extend outside the first slot SLT1 in the guard ring region GRR with respect to the width direction intersecting with its extending direction and along the whole part with respect to the width direction intersecting with the extending direction of the dicing line region DLR.

Also, the width (in a direction intersecting with the direction in which the second slot SLT2 extends, in a plan view) of the second slot SLT2 is preferably similar to the width w of the first slot SLT1 in the above embodiment.

Therefore, the second slots SLT2 are mainly arranged in the dicing line region DLR. The second slots SLT2 are arranged at regular intervals (pitch), in a plan view, in a direction in which the first slots SLT1 extend. Specifically, it is preferred that the interval P be 100 μm or greater but not greater than 1000 μm. The dicing line region DLR extends in the same direction as that of the guard ring region GRR and the chip region IMC. That is, the dicing line region DLR extends so as to form a planar rectangle. For this reason, the second slot SLT2 extends in the direction which intersects with the direction (direction in which the edge portion of the chip region IMC extends) in which the dicing line region DLR extends. The second slots SLT2 are arranged at regular intervals with respect to the direction in which the dicing line region DLR extends.

When the semiconductor wafer SW is cut along the broken line shown in FIG. 23 into respective semiconductor chips CHP, in the dicing line region DLR, namely, near the circumference, in a plan view, of the semiconductor chip CHP, there are arranged a plurality of second slots SLT2 extending outward from the first slots SLT1 at regular intervals P so as to intersect with the first slots SLT1.

Figure 24:
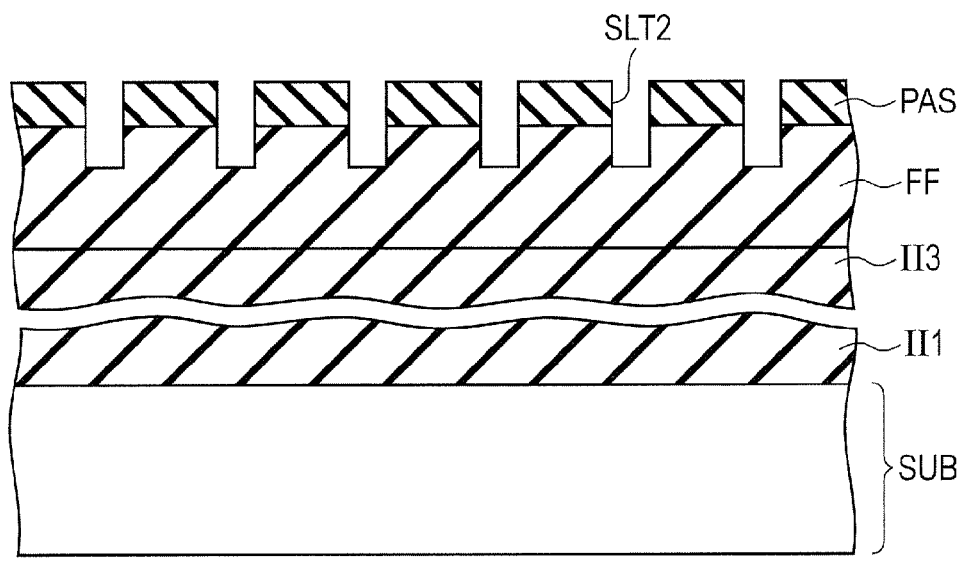
FIG. 24 is a schematic cross-sectional view illustrating a portion along line XXIV-XXIV in FIG. 23.

Referring to FIG. 24, as in the case of the first slot SLT1, the second slot SLT2 is formed as a removed part of the passivation film PAS. That is, according to the present embodiment, the removed part of the passivation film PAS is made by the first and second slots SLT1 and SLT2. In other regions, there exists no removed part such as the level difference LVL of the first embodiment.

It is preferred that the second slot SLT2 be formed at least as deep as the first slot SLT1. In this regard, as in the fourth embodiment, the first slot SLT1 is formed such that it reaches the upper surface of the top-layer metal wiring TML of the guard ring GR from the upper surface of the passivation film PAS. For this reason, it is preferred that the second slot SLT2 extends in a vertical direction in FIG. 24 until the depth of at least reaching the upper surface of the top-layer metal wiring TML of the guard ring GR.

Figure 25:
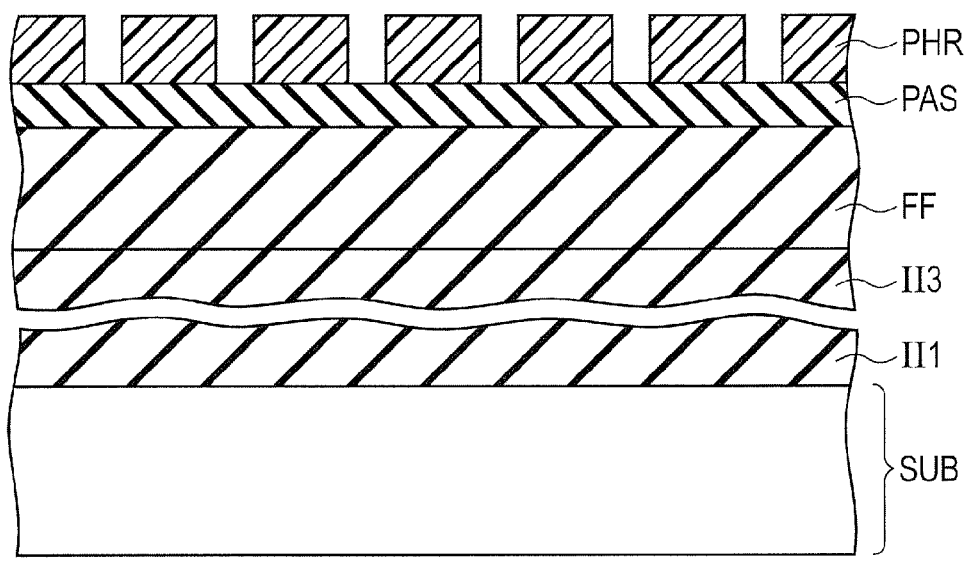
FIG. 25 is a schematic cross-sectional view illustrating a first step of a manufacturing method of a semiconductor device according to the sixth embodiment.

Referring to FIG. 25, according to the manufacturing method of the present embodiment, along with the step of forming the first slot SLT1 shown in FIGS. 17 to 18, for example, a process of forming the above second slot SLT2 in the dicing line region DLR is performed. As shown in FIG. 25, a pattern of the photoresist PHR for forming the slot SLT2 is formed by the ordinary photoengraving process. The second slot SLT2 is formed immediately below the opening of the photoresist PHR.

Next, the operation and effect of the present embodiment will be explained. In addition to the operation and effect of the fourth embodiment, the present embodiment has the following operation and effect.

According to the present embodiment, the second slot SLT2 is formed outside the region in which the first slot SLT1 is formed so as to intersect with the direction in which the dicing line region DLR extends. For this reason, during the dicing, when the dicing line region is cut along its extending direction, the outer edge portion of the semiconductor chip CHP after being cut has cut-away portions of the second slot SLT2 at regular intervals in the extending direction thereof. Therefore, the length of the passivation film PAS in the diced region does not exceed the interval (pitch P) at which the second slots SLT2 are arranged.

For this reason, it is possible to suppress the occurrence of errors such as the circuit having an insulation problem etc. when a remainder (so-called "burr") of the passivation film PAS existing in the outer edge portion of the semiconductor chip CHP after being cut enters the inside of the circuit of the semiconductor chip CHP.

When the second slot SLT2 is not formed and, during the dicing, for example, when the remainder of the passivation film PAS having a length equal to one side of the rectangle of the chip region IMC is produced, if it enters the inside of the circuit, it is very likely that the circuit has an insulation problem. The second slots SLT2 serve to suppress it.

According to the present embodiment, as described above, it is preferred that the second slots SLT2 be formed such that they cross the whole width direction (the direction which intersects with the extending direction) of the dicing line region DLR and coupling, with each other, the first slots SLT1 of the pair of semiconductor chips CHP adjacent to each other in the semiconductor wafer SW (before being cut). In this way, even if the cutting is performed at any position with respect to the width direction of the dicing line region DLR, it is made sure that, because of the second slots SLT2, the passivation film PAS above does not become longer than the pitch P.

According to the present embodiment, it is preferred that the film thickness of the passivation film PAS be 0.3 μm or smaller. In this way, when the passivation film PAS is cut, the remainder of the above passivation film PAS becomes short and the thickness of the burr described above becomes small (short), further enhancing the above effect.

Seventh Embodiment

The sixth embodiment is an example in which the second slot SLT2 is applied to the semiconductor chip CHP of the fourth embodiment. However, the present embodiment is an example in which the second slot SLT2 is applied to the semiconductor chip CHP of the fifth embodiment.

Figure 26:
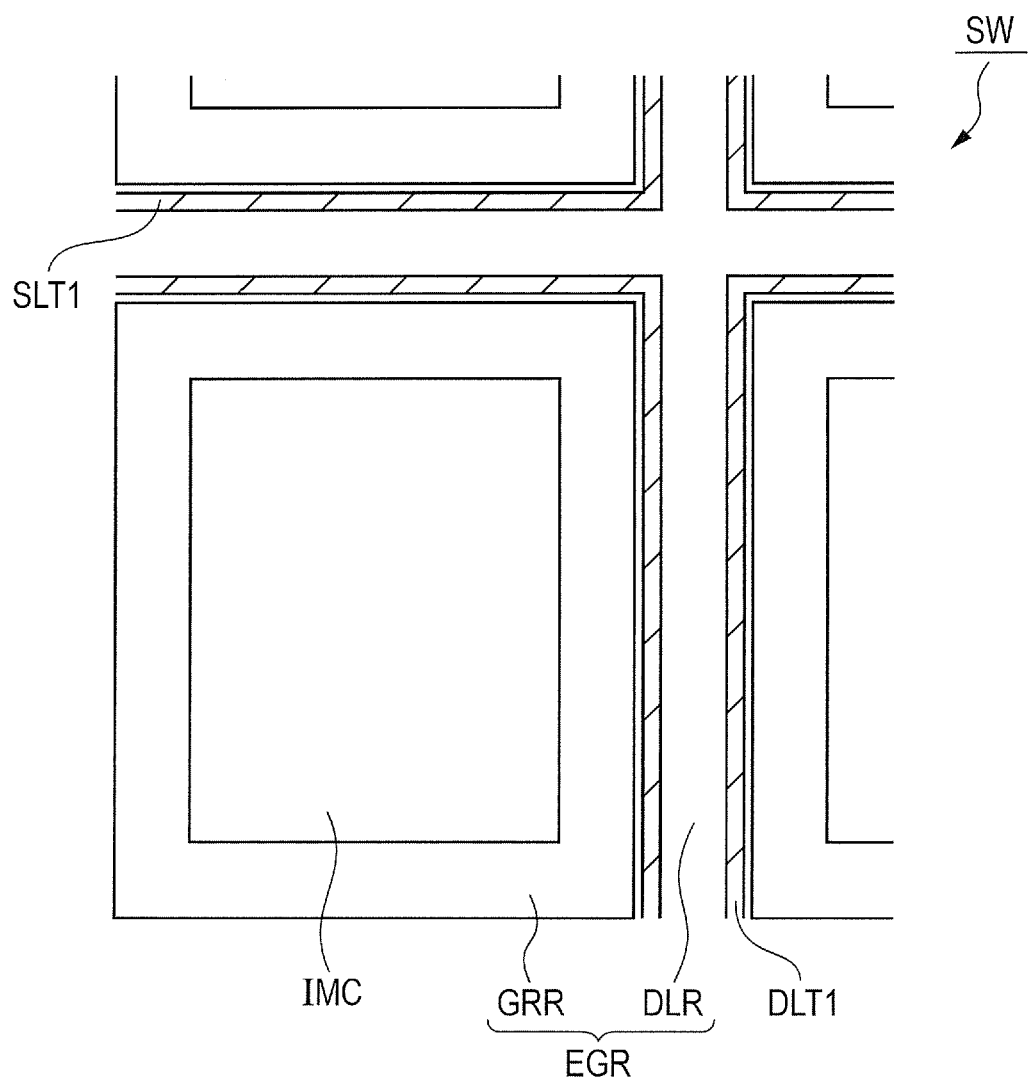
FIG. 26 is a schematic plan view illustrating part of a semiconductor wafer for forming the semiconductor chip according to the fifth embodiment.
Figure 27:
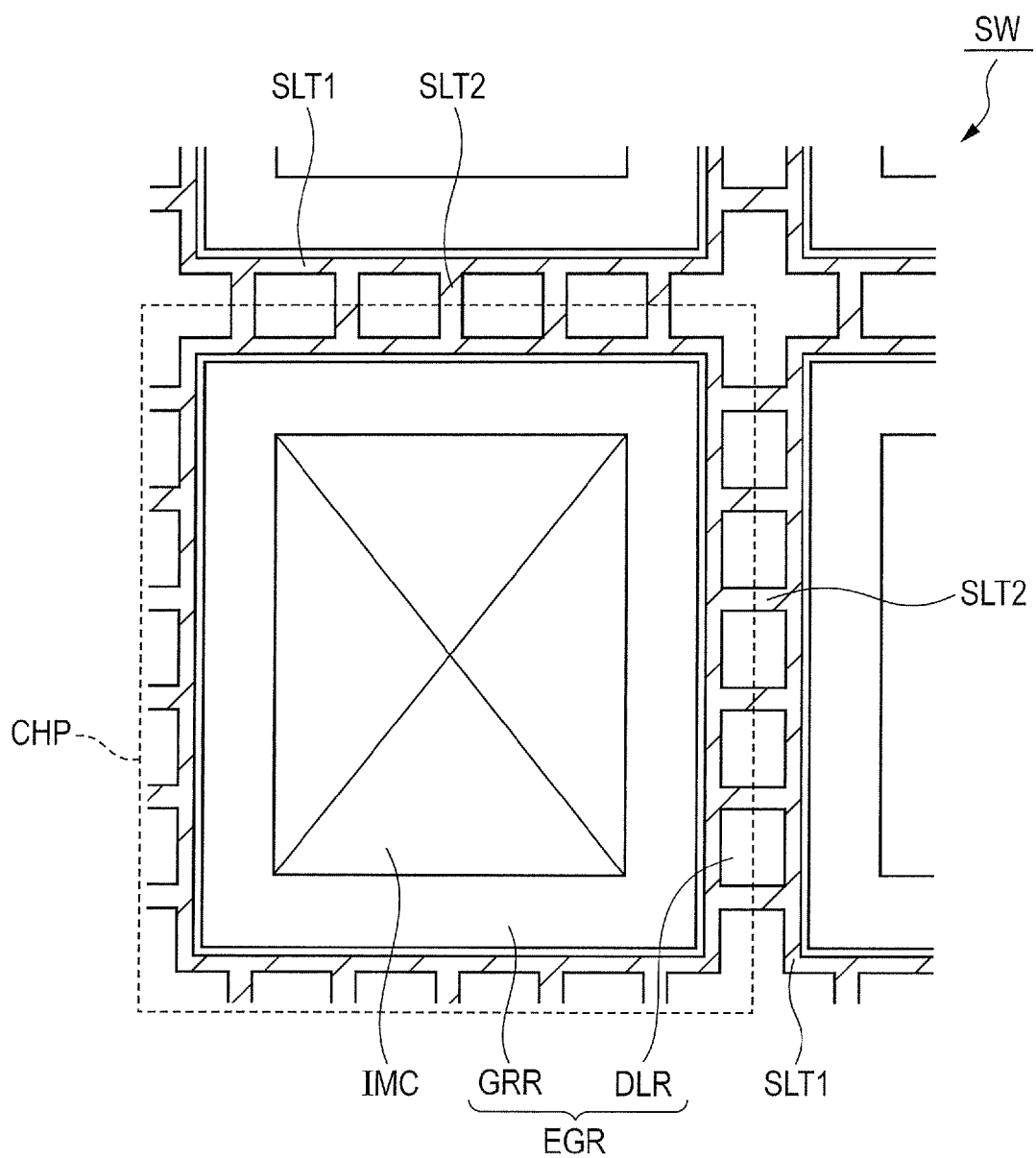
FIG. 27 is a schematic plan view illustrating part of a semiconductor wafer for forming the semiconductor chip according to a seventh embodiment.

Referring to FIG. 26, according to the semiconductor chip CHP of the fifth embodiment, the first slot SLT1 is formed outside the top-layer metal wiring TML of the guard ring GR. Therefore, usually, the first slot SLT1 is formed outside the guard ring region GRR, namely, in the dicing line region DLR. In this respect, the present embodiment is different from the sixth embodiment. Referring to FIG. 27, since the present embodiment is similar to the sixth embodiment in other respects, explanation thereof will be omitted.

According to the present embodiment, the first slot SLT1 is formed in the dicing line region DLR. Therefore, the second slot SLT2 formed outside the dicing line region DLR extends in part of the region alone, with respect to the width direction, of the dicing line region DLR. However, if the dicing is performed outside the first slot SLT1, the same operation and effect as in the sixth embodiment can be achieved.

In the present embodiment also, from the same viewpoint as in the sixth embodiment, it is preferred that the film thickness of the passivation film PAS be 0.3 μm or smaller.

The above description has been mainly about the semiconductor chip CHP after dicing. However, the semiconductor waver SW before dicing in each embodiment naturally has the same feature as the semiconductor chip CHP with respect to the chip region IMC and the edge region EGR. Part of what are described in other embodiments will be shown below.

(1) The semiconductor wafer includes: a semiconductor substrate having a main surface; an element region where photodetectors are formed in the semiconductor substrate, being arranged in a matrix pattern over the main surface; and a non-element region formed outside the element region over the main surface and separating a plurality of element regions. The non-element region includes: a top-layer metal wiring in a top layer of metal wirings formed in the non-element region; a flattening film covering an upper surface of the top-layer metal wiring; and a protecting film formed over the flattening film. A removed part where the protecting film is removed is formed in at least part of the non-element region.

(2) In the semiconductor wafer of (1), the removed part includes a level difference where an upper surface of the flattening film is located on the other side of the upper surface of the top-layer metal wiring opposed to the semiconductor substrate.

(3) In the semiconductor wafer of (1), the top-layer metal wiring surrounds the element region in a plan view.

(4) In the semiconductor wafer of (2), the removed part includes a first slot that reaches at least a depth of the upper surface of the top-layer metal wiring from the upper surface of the flattening film in part of a region of the level difference.

(5) In the semiconductor wafer of (4), the first slot is formed immediately above the top-layer metal wiring.

(6) In the semiconductor wafer of (4), the first slot is formed outside the top-layer metal wiring in a plan view and, more specifically, on the other side of the top-layer metal wiring opposed to the element region.

(7) In the semiconductor wafer of (1), the removed part includes a first slot reaching at least the depth of the upper surface of the top-layer metal wiring from an upper surface of the protecting film. The above protecting film is formed in a region except for the first slot in the main surface.

(8) In the semiconductor wafer of (7), the first slot is formed immediately above the top-layer metal wiring.

(9) In the semiconductor wafer of (7), the first slot is formed outside the top-layer metal wiring in a plan view and, more specifically, on the other side of the top-layer metal wiring opposed to the element region.

(10) In the semiconductor wafer of (7), the first slot extends, in a plan view, along an edge portion of the element region. The removed part further includes a second slot, outside the first slots and, more specifically, on the other side of the top-layer metal wiring opposed to the element region, in a plan view, extending in a direction intersecting with the first slot.

(11) In the semiconductor wafer of (7), a film thickness of the protecting film is 0.3 μm or smaller.

The inventions made by the present inventors have been described specifically according to the embodiments described above. It should be understood, however, that the present invention is not limited to the above embodiments but can be variously changed without departing from the scope of the invention.

What is claimed is:

1. A semiconductor device, comprising:
    a semiconductor substrate having a main surface;
    an element region where photodetectors are formed in the semiconductor substrate; and
    a non-element region formed outside the element region over the main surface,
    the non-element region including:
    a top-layer metal wiring in a top layer of metal wirings formed in the non-element region;
    a flattening film covering an upper surface of the top-layer metal wiring; and
    a protecting film formed over the flattening film;
    a removed part formed by removing the protecting film in at least part of the non-element region; and
    a first slot formed by removing only a portion of the flattening film exposed by the removed part, the first slot reaching at least a depth of the upper surface of the top-layer metal wiring from the upper surface of the flattening film.

2. A semiconductor device according to claim 1, wherein the removed part includes a level difference where a bottom of the level difference is an upper surface of the flattening film located above an upper surface of the top-layer metal wiring on a side opposite to the semiconductor substrate.

3. A semiconductor device according to claim 1, wherein the top-layer metal wiring surrounds the element region in a plan view.

4. A semiconductor device according to claim 2, wherein the first slot reaches at least the depth of the upper surface of the top-layer metal wiring from the upper surface of the flattening film in part of a region of the level difference.

5. A semiconductor device according to claim 4, wherein the first slot is formed immediately above the top-layer metal wiring.

6. A semiconductor device according to claim 4, wherein the first slot is formed outside the top-layer metal wiring in a plan view.

7. A semiconductor device according to claim 1,
    wherein the removed part includes a first slot reaching at least the depth of the upper surface of the top-layer metal wiring from an upper surface of the protecting film, and
    wherein the protecting film extends to an end portion of the main surface.

8. A semiconductor device according to claim 7, wherein the first slot is formed immediately above the top-layer metal wiring.

9. A semiconductor device according to claim 7, wherein the first slot is formed outside the top-layer metal wiring over the main surface.

10. A semiconductor device according to claim 7,
wherein the first slot extends, in a plan view, along an edge portion of the element region, and
wherein the removed part further includes a second slot, outside the first slot, in a plan view, extending in a direction intersecting with the first slot.

11. A semiconductor device according to claim 7, wherein a film thickness of the protecting film is 0.3 µm or smaller.

12. A method for manufacturing a semiconductor device, comprising
providing a semiconductor substrate having a main surface;
forming an element region where photodetecors are formed in the semiconductor substrate and a non-element region outside the element region over the main surface;
forming a top-layer metal wiring in a top layer of metal wirings formed in the non-element region, a flattening film covering an upper surface of the top-layer metal wiring, and a protecting film formed over the flattening film in the non-element region;
forming a removed part where the protecting film is removed such that the flattening film remains over a surface of the top-layer metal wiring in the non-element region; and
forming a first slot by removing only a portion of the flattening film exposed by the removed part, the first slot reaching at least a depth of the upper surface of the top-layer metal wiring from the upper surface of the flattening film.

13. A method for manufacturing a semiconductor device according to claim 12, wherein the removed part includes a level difference where a bottom of the level difference is an upper surface of the flattening film located above an upper surface of the top-layer metal wiring on a side opposite to the semiconductor substrate.

14. A method for manufacturing a semiconductor device according to claim 13, wherein the first slot is formed in part of the region of the level difference.

15. A method for manufacturing a semiconductor device according to claim 14, wherein the first slot is formed immediately above the top-layer metal wiring.

16. A method for manufacturing a semiconductor device according to claim 14, wherein the first slot is formed, in a plan view, outside the top-layer metal wiring.

17. A method for manufacturing a semiconductor device according to claim 12,
wherein the removed part includes a first slot reaching at least the depth of the upper surface of the top-layer metal wiring from an upper surface of the protecting film, and
wherein the protecting film extends to an end portion of the main surface.

18. A method for manufacturing a semiconductor device according to claim 17, wherein the first slot is formed immediately above the top-layer metal wiring.

19. A method for manufacturing a semiconductor device according to claim 17, wherein the first slot is formed outside the top-layer metal wiring over the main surface.

20. A method for manufacturing a semiconductor device according to claim 17,
wherein the first slot extends, in a plan view, along an edge portion of the element region, and
wherein, in the step of forming the removed part, a second slot is formed outside the first slot, in a plan view, extending in a direction intersecting with the first slot.

* * * * *